(12) United States Patent
Lu et al.

(10) Patent No.: US 8,053,859 B2
(45) Date of Patent: Nov. 8, 2011

(54) SEMICONDUCTOR DEVICE AND THE METHOD OF MANUFACTURING THE SAME

(75) Inventors: Hong-fei Lu, Matsumoto (JP); Shinichi Jimbo, Ishikawa-gun (JP)

(73) Assignee: Fuji Electric Co., Ltd. (JP)

( * ) Notice: Subject to any disclaimer, the term of this patent is extended or adjusted under 35 U.S.C. 154(b) by 646 days.

(21) Appl. No.: 11/817,683

(22) PCT Filed: Feb. 28, 2006

(86) PCT No.: PCT/JP2006/304215
§ 371 (c)(1),
(2), (4) Date: Nov. 21, 2007

(87) PCT Pub. No.: WO2006/093309
PCT Pub. Date: Sep. 8, 2006

(65) Prior Publication Data
US 2009/0050932 A1    Feb. 26, 2009

(30) Foreign Application Priority Data
Mar. 3, 2005    (JP) ................. 2005-058836

(51) Int. Cl.
*H01L 29/739*    (2006.01)
*H01L 29/786*    (2006.01)

(52) U.S. Cl. . 257/492; 257/491; 257/487; 257/E29.015; 257/E29.06

(58) Field of Classification Search ............. 257/29.012, 257/492, 139, 168
See application file for complete search history.

(56) References Cited

U.S. PATENT DOCUMENTS
5,396,087 A    3/1995    Baliga
(Continued)

FOREIGN PATENT DOCUMENTS
JP    08-064686 A    3/1996
(Continued)

OTHER PUBLICATIONS
Chinese Office Action dated Mar. 6, 2009, issued in corresponding Chinese Application No. 2006800069180. Partial English translation provided.
(Continued)

*Primary Examiner* — Victor A Mandala
*Assistant Examiner* — William Harriston
(74) *Attorney, Agent, or Firm* — Rossi, Kimms & McDowell LLP

(57) ABSTRACT

To provide a semiconductor device that exhibits a high breakdown voltage, excellent thermal properties, a high latch-up withstanding capability and low on-resistance. The semiconductor device according to the invention, which includes a buried insulator region 5 disposed between an $n^-$-type drift layer 3 and a first n-type region 7 above $n^-$-type drift layer 3, facilitates limiting the emitter hole current, preventing latch-up from occurring, raising neither on-resistance nor on-voltage. The semiconductor device according to the invention, which includes a p-type region 4 disposed between the buried insulator region 5 and $n^-$-type drift layer 3, facilitates depleting $n^-$-type drift layer 3 in the OFF-state of the device. The semiconductor device according to the invention, which includes a second n-type region 6 disposed between the first n-type region 7 and the $n^-$-type drift layer 3, facilitates dissipating the heat caused in the channel region or in the first n-type region 7 to a $p^+$-type collector layer 1a, which is a semiconductor substrate, via the second n-type region 6, $n^-$-type drift layer 3 and an n-type buffer layer 2.

14 Claims, 47 Drawing Sheets

U.S. PATENT DOCUMENTS

| | | | |
|---|---|---|---|
| 6,150,694 A | 11/2000 | Tihanyi | |
| 6,169,299 B1 * | 1/2001 | Kawaji et al. | 257/137 |
| 7,122,864 B2 | 10/2006 | Nagano et al. | |
| 2007/0023855 A1 * | 2/2007 | Hossain et al. | 257/492 |
| 2007/0158678 A1 * | 7/2007 | Udrea | 257/119 |
| 2009/0050932 A1 * | 2/2009 | Lu et al. | 257/139 |

FOREIGN PATENT DOCUMENTS

| | | |
|---|---|---|
| JP | 08-088357 A | 4/1996 |
| JP | 09-153609 A | 6/1997 |
| JP | 09-270513 A | 10/1997 |
| JP | 09-312398 A | 12/1997 |
| JP | 10-294461 A | 11/1998 |
| JP | 11-251331 A | 9/1999 |
| JP | 2000-223695 A | 8/2000 |
| JP | 2001-515662 A | 9/2001 |
| JP | 2002-190595 A | 7/2002 |
| JP | 2004-281781 A | 10/2004 |
| JP | 2007042826 A * | 2/2007 |
| WO | 03/103036 A1 | 12/2003 |

OTHER PUBLICATIONS

PCT International Search Report and Written Opinion issued in the corresponding PCT application No. PCT/JP2006/304215 mailed on Jun. 20, 2006.

* cited by examiner

US 8,053,859 B2

SEMICONDUCTOR DEVICE AND THE METHOD OF MANUFACTURING THE SAME

This application is the national phase under 35 U.S.C. 371 of PCT International Application No. PCT/JP2006/304215 which has an International filing date of Feb. 28, 2006, which designated the United States of America and which claims priority on Japanese Patent Application number JP 2005-058836, filed Mar. 3, 2005, the entire contents of which are hereby incorporated herein by reference.

TECHNICAL FIELD

The present invention relates to semiconductor devices and the method of manufacturing the semiconductor devices. Specifically, the present invention relates also to semiconductor devices having a partial SOI (silicon on insulator) structure and the method of manufacturing the semiconductor devices having a partial SOI structure.

BACKGROUND ART

In order to improve the performance of fuel consumption in automobiles and to purify the exhaust gas from the automobiles, engine control has been conducted electronically and the electronic engine control techniques have been advanced. An igniter is a spark plug controller that feeds electric energy to a spark plug through an ignition coil. An IGBT (insulated gate bipolar transistor) is used for the switching device of an ignition system. The IGBT is advantageous, since the driver circuit configuration for driving the IGBT is simple, the IGBT exhibits excellent protection performances against reverse battery connection and the SOA of the IGBT is wide.

For obtaining high reliability and high performances, a one-chip intelligent IGBT which integrates a control circuit, an overheat detection function and a current control function has been put into market. FIG. 59 is a block circuit diagram of a standard ignition system that uses an IGBT. For the circuit configuration shown in FIG. 59, a self-separation process that exhibits excellent cost performances is employed to integrate an IGBT 101, a control IC 102, a surge protection diode 103, a resistor 104 and a clump diode 105 into one chip. In FIG. 59, an ignition coil 106 and a spark plug 107 are also shown.

FIG. 60 is a cross sectional view showing the integrated structure of IGBT 101 and an NMOS transistor in control IC 102 in FIG. 59. A low-voltage lateral NMOS transistor 110 is formed such that NMOS transistor 110 includes a p$^-$-type well region 118 in the surface portion of an n$^-$-type drift layer 113. The source electrode 125b of low-voltage lateral NMOS transistor 110 is connected electrically to the gate electrode 121a of IGBT 101 and to an input terminal 108 connected to control IC 102 in the ignition system. If a negative input signal is fed to the gate terminal of the intelligent IGBT, the parasitic thyristor shown in FIG. 61 is activated, destroying the intelligent IGBT.

FIG. 61 is a cross sectional view schematically showing the parasitic thyristor associated with low-voltage lateral NMOS transistor 110. The parasitic thyristor is formed by a thyristor connection of a PNP transistor and an NPN transistor. The PNP transistor includes an emitter region formed by a p$^+$-type collector layer 111, a base region formed by an n$^+$-type buffer layer 112 and n$^-$-type drift layer 113, and a collector region formed by p$^-$-type well region 118. The NPN transistor includes an emitter region formed by the n$^+$-type source region 123 of low-voltage lateral NMOS transistor 110, a base region formed by p$^-$-type well region 118, and a collector region formed by n$^+$-type buffer layer 112 and n$^-$-type drift layer 113.

Since the PN diode formed by the n$^+$-type source region 123 and the p$^-$-type well region 118 is forwardly biased when a negative input signal is input to the gate terminal (G) of IGBT 101, the parasitic thyristor is activated. To prevent the parasitic thyristor from functioning, it is necessary to apply a protection network formed by Zener diodes 121 and resistors 122 between input terminal 108 and the gate terminal (G) of IGBT 101 and to connect the protection network to the n$^+$-type source region 123 and the p$^-$-type well region 118 of the low-voltage lateral NMOS transistor 110. For securing a high electrostatic discharge (ESD) withstanding capability for the protection network, it is imperative to set the PN-junction width of the Zener diode 121 to be between several mm and several tens mm, resulting in a wide chip area.

If the intelligent IGBT, which integrates IGBT 101, control IC 102, surge protection diode 103, resistor 104 and clump diode 105 into one chip (cf. FIG. 59), is manufactured by the SOI process, the heat generated in the device will be hardly dissipated, causing troubles. The heat generated in the device is hardly dissipated, since the thermal resistivity of the SiO$_2$ layer buried in the chip is about one hundred times higher than that of silicon. Moreover, since the ESD protection devices manufactured on the SOI is weaker than the protection device manufactured on the bulk wafer, it is not preferable to use the intelligent IGBT manufactured on the SOI wafer for automobiles application. Since the SOI wafer is from 5 to 6 times as expensive as the usual bulk wafer, its wide adoption in consumer application has not yet been achieved.

Types of Insulated-gate power semiconductor devices, which have a structure including an oxide film and such an insulator layer buried locally in the device (partial SOI structure), are known to those skilled in the art (cf. the following Patent Documents 1 and 2). FIG. 62 is a cross sectional view of the semiconductor device equivalent to the semiconductor device disclosed in the Patent Document 1. Referring now to FIG. 62, an oxide film 115 is buried locally between n$^-$-type drift layer 113 and an n-type semiconductor layer 117 in the device surface. The n-type semiconductor layer 117 and n$^-$-type drift layer 113 are in contact with each other in the area, therein oxide film 115 is not present.

A p$^-$-type well region 118 formed locally on oxide film 115 is in contact with n$^-$-type drift layer 113 in the area, therein oxide film 115 is not present. However, p$^-$-type well region 118 is not extended below oxide film 115. Besides, a semiconductor apparatus, which includes a vertical insulated gate power transistor with a semiconductor substrate as one of its constituent elements thereof and a lateral insulated gate power transistor in a SOI structure formed on an insulator film covering the semiconductor substrate, is known to those skilled in the art (cf. the following Patent Document 3).

[Patent Document 1] Published Japanese Translation of PCT International Publication for Patent Application 2001-515662
[Patent Document 2] Publication of Unexamined Japanese Patent Application Hei. 9 (1997)-270513
[Patent Document 3] Publication of Unexamined Japanese Patent Application Hei. 9 (1997)-312398

DISCLOSURE OF THE INVENTION

Problems to be Solved by the Invention

Since there exists no p-type semiconductor region between the buried oxide film 115 and n$^-$-type drift layer 113 in the power semiconductor device having the structure shown in FIG. 62, the junction area between p⁻-type well region 118 and n⁻-type drift layer 113 is small. Due to the small junction area between p⁻-type well region 118 and n⁻-type drift layer 113, it is hard to deplete n⁻-type drift layer 113 when a reverse bias voltage is applied and, therefore, it is impossible to secure a high breakdown voltage.

In view of the foregoing, it would be desirable to obviate the problems described above. It would be also desirable to provide a semiconductor device that exhibits a high breakdown voltage, to provide a semiconductor device that exhibits a high latch-up withstanding capability, and to provide an inexpensive semiconductor device that has a partial SOI structure, or to provide a semiconductor device having a partial SOI structure that exhibits excellent thermal properties. It would be desirable to provide the method of manufacturing such a semiconductor device as described above.

Means for Solving the Problems

According to the subject matter of the appended Claim 1, there is provided a semiconductor device including:
a drift layer of a first conductivity type;
a first region of the first conductivity type above the drift layer, the resistivity of the first region being lower than the resistivity of the drift layer;
a buried insulator region disposed locally between the first region and the drift layer;
a region of a second conductivity type between the buried insulator region and the drift layer, the region of the second conductivity type being in contact with the drift layer;
a body region of the second conductivity type in contact with the first region;
a low-resistance region of the first conductivity type in the body region;
a contact region of the second conductivity type in the body region;
a front surface electrode connected electrically to the contact region and the low-resistance region;
a gate insulator film on the portion of the body region between the first region and the low-resistance region; and
a gate electrode on the side opposite to the body region with the gate insulator film interposed therebetween.

According to the subject matter of the appended Claim 2, the semiconductor device described in the appended Claim 1 further includes a second region of the first conductivity type disposed locally between the first region and the drift layer, the resistivity of the second region being lower than the resistivity of the first region.

According to the subject matter of the appended Claim 3, the region of the second conductivity type in the semiconductor device described in the appended Claim 1 or 2 is a floating region.

According to the subject matter of the appended Claim 4, there is provided a semiconductor device including:
a drift layer of a first conductivity type;
a first region of the first conductivity type on the drift layer, the resistivity of the first region being lower than the resistivity of the drift layer;
a buried insulator region disposed locally between the first region and the drift layer;
a body region of a second conductivity type on the buried insulator region, the body region being in contact with the first region;
a low-resistance region of the first conductivity type in the body region;
a contact region of the second conductivity type in the body region;
a front surface electrode connected electrically to the contact region and the low-resistance region;
a gate insulator film on the portion of the body region between the first region and the low-resistance region;
a gate electrode on the side opposite to the body region with the gate insulator film interposed therebetween; and
the body region being extended below the buried insulator region around one of the buried insulator region edges.

According to the subject matter of the appended Claim 5, the semiconductor device described in any of the appended Claims 1 through 4 includes a trench gate structure including a trench extended down to the buried insulator region, and the trench containing the gate insulator film and the gate electrode disposed therein.

According to the subject matter of the appended Claim 6, the semiconductor device described in any of the appended Claims 1 through 4 includes a planar gate structure including the gate insulator film and the gate electrode disposed on the body region.

According to the subject matter of the appended Claim 7, the semiconductor device described in the appended Claim 6 further includes a buried low-resistance region of the second conductivity type disposed below the low-resistance region of the first conductivity type in the body region of the second conductivity type.

According to the subject matter of the appended Claim 8, the body region is in contact with the buried insulator region in the semiconductor device described in any of the appended Claims 1, 2, 3, 4, 6, and 7.

According to the subject matter of the appended Claim 9, the body region is above the buried insulator region in the semiconductor device described in any of the appended Claims 1, 2, 3, 5, 6, and 7.

According to the subject matter of the appended Claim 10, the semiconductor device described in any of the appended Claims 1 through 9 further includes a low-resistance layer of the second conductivity type on the side of the drift layer opposite to the first region and a back surface electrode connected electrically to the low-resistance layer of the second conductivity type.

According to the subject matter of the appended Claim 11, the semiconductor device described in any of the appended Claims 1 through 9 further includes a low-resistance layer of the first conductivity type on the side of the drift layer opposite to the first region and a back surface electrode connected electrically to the low-resistance layer of the first conductivity type.

According to the subject matter of the appended Claim 12, there is provided a method of manufacturing a semiconductor device, the method including the steps of:
forming a region of a second conductivity type in the surface of a drift layer of a first conductivity type;
forming an oxide film that will be constituting a buried insulator region on the drift layer and the region of the second conductivity type;
removing a part of the oxide film to expose a part of the drift layer;
growing a semiconductor of the first conductivity type by epitaxial growth from the exposed surface of the drift layer to fill the removed part of the oxide film with the semiconductor, and growing the semiconductor of the first conductivity type by epitaxial growth laterally along the oxide film to cover the oxide film with semiconductor layers of the first conductivity type;

polishing the semiconductor layers grown on the oxide film by the epitaxial growth such that the semiconductor layers have a predetermined thickness; and forming a surface structure for the semiconductor device on the polished semiconductor layers.

According to the subject matter of the appended Claim 13, there is provided a method of manufacturing a semiconductor device, the method including the steps of:

preparing a first wafer including a drift layer of a first conductivity type, a region of a second conductivity type on the drift layer, and a first oxide film that will be constituting a buried insulator region on the region of the second conductivity type;

preparing a second wafer of the first conductivity type including a semiconductor layer of the first conductivity type and a second oxide film that will be constituting the buried insulator region in the surface of the semiconductor layer;

bonding the first wafer and the second wafer such that the first oxide film and the second oxide film are in contact with each other;

polishing the semiconductor layer such that the semiconductor layer has a predetermined thickness;

forming a trench from the surface of the polished semiconductor layer down to the drift layer through the buried insulator region to partly expose the drift layer in the bottom of the trench;

growing a semiconductor of the first conductivity type by epitaxial growth from the exposed surface of the drift layer to fill the trench to the surface of the polished semiconductor layer with the semiconductor of the first conductivity type; and forming a surface structure for the semiconductor device on the portion of the semiconductor layer other than the trench filled with the semiconductor of the first conductivity type.

According to the subject matter of the appended Claim 14, the step of forming the surface structure in the method described in the appended Claim 12 further includes the step of forming a trench from the surface of the polished semiconductor layers down to the oxide film such that the trench involves therein the joint portion, therein the semiconductor layers of the first conductivity type grown laterally by epitaxial growth from the different areas, therefrom the oxide film has been removed, meet and join each other to remove the joint portion of the semiconductor layers.

According to the subject matter of the appended Claim 15, the method described in the appended Claim 14 further includes the step of filling the trench with a silicon oxide film and polysilicon to form a trench separation structure.

According to the subject matter of the appended Claim 16, the method described in the appended Claim 14 further includes the step of filling the trench with a gate insulator film and a gate electrode to form a trench gate structure.

Since the buried insulator region prevents the holes (electrons) injected from the back surface electrode in the ON-state of the device from flowing into the first region of the first conductivity type from the drift layer of the first conductivity type according to the subject matter of any of the appended Claims 1 through 4, the electrons (holes) are accumulated in the first region of the first conductivity type. Therefore, the latch-up withstanding capability and the avalanche withstanding capability of the device are improved.

When a voltage is applied to the back surface electrode in the OFF-state of the device, depletion layers expand from the PN-junction between the region of the second conductivity type and the drift layer of the first conductivity type due to the provision of the region of the second conductivity type between the buried insulator region and the drift layer of the first conductivity type according to the subject matter of any of the appended Claims 1 through 3. Therefore, the drift layer of the first conductivity type is depleted easily. Thus, a high breakdown voltage is secured.

When a voltage is applied to the back surface electrode in the OFF-state of the device, depletion layers expand from the PN-junction between the body region of the second conductivity type and the drift layer of the first conductivity type due to the extension of the body region of the second conductivity type below the buried insulator region according to the subject matter of the appended Claim 4. Therefore, the drift layer of the first conductivity type is depleted easily. Thus, a high breakdown voltage is secured.

Due to the provision of the buried low-resistance region of the second conductivity type below the low-resistance region of the first conductivity type in the body region of the second conductivity type according to the subject matter of the appended Claim 7, the holes from the channel region flow through the buried low-resistance region of the second conductivity type. Since the voltage drop caused by the holes flowing through the buried low-resistance region is lower than the working voltage of the parasitic NPN transistor, the latch-up caused by the parasitic thyristor is prevented from occurring. Therefore, a high latch-up withstanding capability is obtained.

According to the subject matter of the appended Claim 12 or 13, a semiconductor device having a partial SOI structure is manufactured with low manufacturing costs. Therefore, a semiconductor device, having a partial SOI structure and exhibiting a high latch-up withstanding capability, a high avalanche withstanding capability and excellent thermal properties, is obtained with low manufacturing costs. According to the subject matter of the appended Claim 14, a trench is formed such that the trench removes the junction portion of semiconductor layers of the first conductivity type, in which the semiconductor layers grown laterally by epitaxial growth meet and join each other. As a result, the stacking faults and dislocations caused in the junction portion of the semiconductor layers are removed.

Effects of the Invention

The semiconductor device according to the invention exhibits a high breakdown voltage and a high latch-up withstanding capability. Especially, excellent thermal properties are realized in the semiconductor device according to the invention by the employment of a partial SOI structure. The manufacturing method according to the invention facilitates manufacturing a semiconductor device, having a partial SOI structure and exhibiting a high breakdown voltage, a high latch-up withstanding capability and excellent thermal properties, with low manufacturing costs.

EXPLANATIONS OF LETTERS OR NUMERALS

Figure 1:
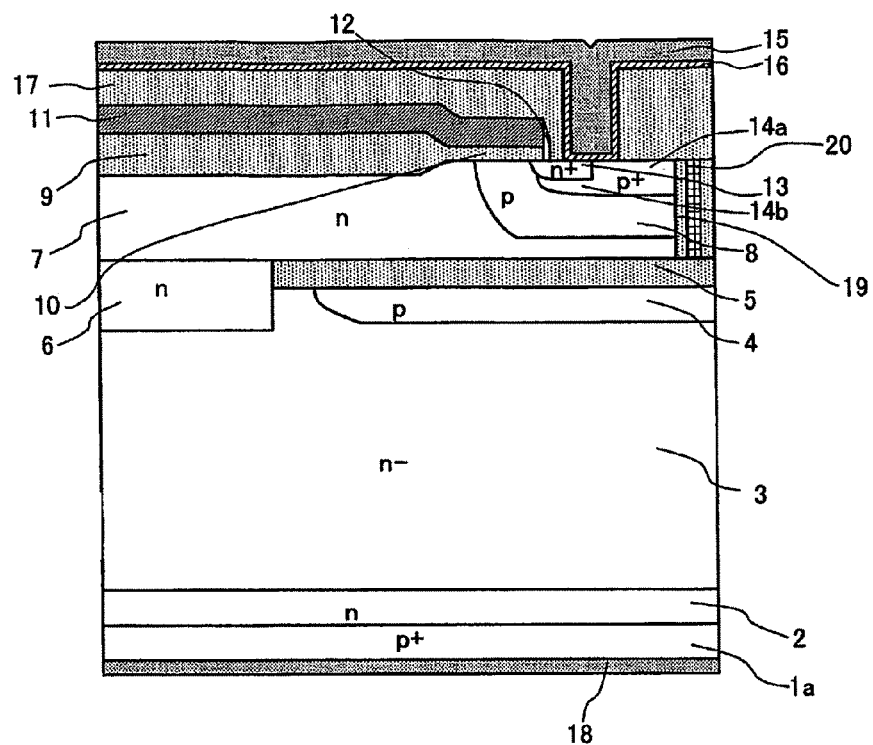
FIG. 1 is a cross sectional view of a semiconductor device according to a first embodiment of the invention.

1$a$: Low-resistance layer of the second conductivity type ($p^+$-type collector layer (Low-resistance layer))

1$b$: Low-resistance layer of the first conductivity type ($n^+$-type drain layer)

3: Drift layer of the first conductivity type ($n^-$-type drift layer)

4: Region of the second conductivity type (p-type region)

5: Buried insulator region

6: Second region of the first conductivity type (Second n-type region)

7: First region of the first conductivity type (First n-type region)

8: Body region of the second conductivity type (p-type body region)

10: Gate insulator film (Gate oxide film)

11: Polysilicon gate electrode

12: Gate-side-wall spacer film

13: Low-resistance region of the first conductivity type ($n^+$-type emitter region)

14$a$: Contact region of the second conductivity type ($p^+$-type body contact region)

14$b$: Buried low-resistance region of the second conductivity type ($p^+$-type buried low-resistance region)

15: Front surface electrode

18: Back surface electrode

BEST MODE FOR CARRYING OUT THE INVENTION

Now the present invention will be described in detail hereinafter with reference to the accompanied drawing figures that illustrate the preferred embodiments of the invention.

In the following descriptions, the n-type layer or the n-type region is a layer or a region, therein electrons are majority carriers. The p-type layer or the p-type region is a layer or a region, therein holes are majority carriers. The superscript "+" on the letter "n" or "p" indicating the conductivity type of the layer or the region indicates that the layer or the region is doped relatively heavily. The superscript "−" on the letter "n" or "p" indicating the conductivity type of the layer or the region indicates that the layer or the region is doped relatively lightly. In the descriptions of the embodiments of the invention and the drawings that illustrate the embodiments of the invention, the same reference numerals are used to designate the same or similar constituent elements and their duplicated explanations will be omitted for the sake of simplicity.

First Embodiment

FIG. 1 is a cross sectional view of an IGBT according to the first embodiment of the invention. Referring now to FIG. 1, an n-type buffer layer 2 is disposed on a $p^+$-type collector layer (low-resistance layer) 1$a$ and an $n^-$-type drift layer 3 is disposed on n-type buffer layer 2. The first n-type region 7 is above $n^-$-type drift layer 3. A buried insulator region 5, such as an oxide film, is disposed partially between $n^-$-type drift layer 3 and first n-type region 7, constituting a partial SOI structure.

The region between the $n^-$-type drift layer 3 and the first n-type region 7, therein any buried insulator region 5 is not present, is the second n-type region 6. The second n-type region 6 is in contact with $n^-$-type drift layer 3 and first n-type region 7. The $n^-$-type drift layer 3, the second n-type region 6 and the first n-type region 7 constitute the drift region (the IGBT base region) that sustains the breakdown voltage. A p-type region 4 is disposed between the buried insulator region 5 and the n⁻-type drift layer 3, in contact with the n⁻-type drift layer 3 and extended to the vicinity of second n-type region 6.

The p-type region 4 is an electrically floating region, the electric potential thereof is floating. Alternatively, p-type region 4 may be connected electrically to the source electrode. If p-type region 4 is designed as a floating region, the IGBT will be manufactured easily, since the step of connecting p-type region 4 to the source electrode may be omitted.

A trench separation structure including silicon oxide separation films 19 and a polysilicon buried layer 20, which are extended from the semiconductor surface down to buried insulator region 5, is disposed for the separation structure of the device. A p-type body region 8 is disposed above buried insulator region 5 such that p-type body region 8 is spaced apart from buried insulator region 5 and second n-type region 6 and in contact with first n-type region 7. A p⁺-type body contact region (contact region) 14a is formed selectively in the surface potion of body region 8.

The p-type body region 8 and p⁺-type body contact region 14a are extended to the trench separation structure and terminated by trench separation structure. An n⁺-type emitter region (low-resistance region) 13 is formed selectively in the surface portion of p-type body region 8. A p⁺-type buried low-resistance region 14b is below n⁺-type emitter region 13 in p-type body region 8.

A gate oxide film 10 is on the surface of p-type body region 8 between n⁺-type emitter region 13 and first n-type region 7. A LOCOS oxide film 9 continued to gate oxide film 10 is disposed on the first n-type region 7. A polysilicon gate electrode 11 is disposed on gate oxide film 10 and LOCOS oxide film 9. A gate-side-wall spacer film 12 formed of an oxide film or a nitride film is disposed on the emitter-side edge of polysilicon gate electrode 11.

An emitter electrode (front surface electrode) 15 is in contact with n⁺-type emitter region 13 and p⁺-type body contact region 14a via an emitter barrier layer 16. Emitter electrode 15 and emitter barrier layer 16 are insulated from polysilicon gate electrode 11 by an interlayer insulator film 17. A collector electrode (back surface electrode) 18 is in contact with p⁺-type collector layer 1a.

As a voltage higher than the threshold value is applied to polysilicon gate electrode 11, a channel is formed in the interface between p-type body region 8 and gate oxide film 10. A PNP transistor, including an emitter region formed by p⁺-type collector layer 1a; a base region formed by n⁻-type drift layer 3, the second n-type region 6 and the first n-type region 7; and a collector region formed by p-type body region 8, p⁺-type body contact region 14a and p⁺-type buried low-resistance region 14b, is parasitic in the IGBT.

An NPN transistor, including an emitter region formed by the n⁺-type emitter region 13; a base region formed by p-type body region 8, p⁺-type body contact region 14a and p⁺-type buried low-resistance region 14b; and a collector region formed by the first n-type region 7, the second n-type region 6 and n⁻-type drift layer 3, is parasitic in the IGBT. The PNP transistor and the NPN transistor constitute a parasitic thyristor.

Gate-side-wall spacer film 12 is disposed so as not to implant ions into the region, therein the channel is to be formed, in forming p⁺-type buried low-resistance region 14b by ion implantation. If the implanted ions enter the channel region, the threshold value will be affected. Therefore, it is not preferable for the implanted ions to enter the channel region. The p⁺-type buried low-resistance region 14b provides the holes flowing in from the channel with a low-resistance path.

The voltage drop caused across the low-resistance path by the holes flowing through the low-resistance path is suppressed to be 0.7 V or lower.

If the voltage drop caused by the holes flowing into emitter electrode 15 exceeds 0.7 V to the higher side, the parasitic NPN will work and latch-up will be caused by the parasitic thyristor. Therefore, by making the holes flow through p⁺-type buried low-resistance region 14b into emitter electrode 15, the latch-up caused by the parasitic thyristor is prevented from occurring according to the first embodiment. In other words, the latch-up withstanding capability is high. In the case, in which it is not always necessary for the latch-up withstanding capability to be so high, gate-side-wall spacer film 12 and p⁺-type buried low-resistance region 14b may be omitted.

Now the functions of buried insulator region 5 will be described. If the resistivity of the second n-type region 6 is lower than the resistivity of the first n-type region 7 while the device is turning to the ON-state, the electrons will not be hindered due to the existence of buried insulator region 5 from conducting from the first n-type region 7 thereof into the n⁻-type drift layer 3. Therefore, electrons are injected into n⁻-type drift layer 3, causing conductivity modulation. On the other hand, the holes injected from p⁺-type collector layer 1a through n-type buffer layer 2 cause conductivity modulation in n⁻-type drift layer 3.

Since the buried insulator region 5 is interposed, the holes have to flow to the first n-type region 7 through the second n-type region 6. Therefore, it is hard for the holes to flow to first n-type region 7. Therefore, electrons are accumulated in the first n-type region 7. Due to the electron accumulation in first n-type region 7, the ratio of the electron current in the emitter current increases and the ratio of the hole current in the emitter current decreases. Due to this mechanism, the latch-up withstanding capability and the avalanche withstanding capability of the device are improved.

Figure 2:
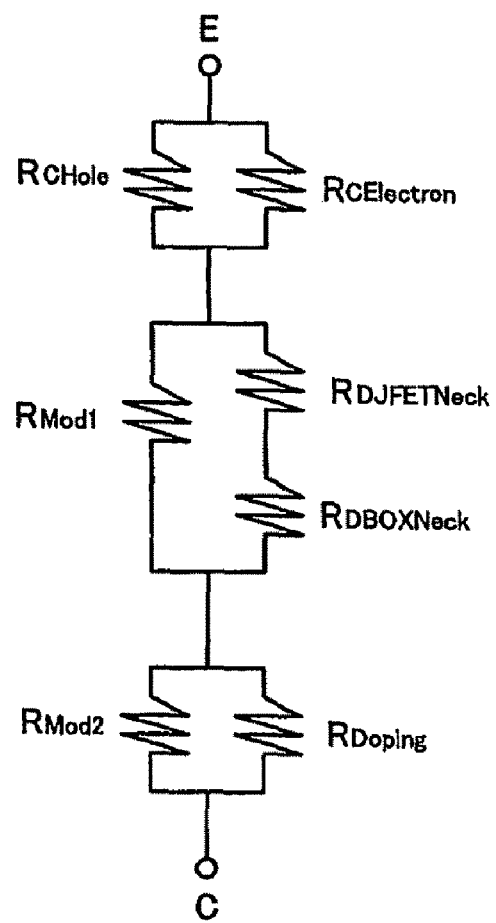
FIG. 2 is an equivalent circuit diagram describing the on-resistance components of the device.

The saturation current $I_{sat}$ and the on-voltage $V_{knee}$ are kept at the respective high and low values due to the reasons described below. FIG. 2 is an equivalent circuit diagram describing the on-resistance components of the device. Referring now to FIG. 2, $R_{Doping}$ is the resistance determined by the doping concentration in n⁻-type drift layer 3. $R_{Mod2}$ is the resistance due to the conductivity modulation in n⁻-type drift layer 3. $R_{DBOXNeck}$ and $R_{DJFETNeck}$ are the resistance components determined by the doping concentrations in second n-type region 6 and first n-type region 7. $R_{Mod1}$ is the resistance due to the conductivity modulations in the second n-type region 6 and the first n-type region 7.

$R_{CHole}$ is the hole channel resistance. $R_{CElectron}$ is the electron channel resistance. The conductivity modulation is caused by the electrons which are the free carriers injected from the channel and by the holes which are the free carriers injected from the collector. Usually, the conductivity modulating carrier concentration is from ten to hundreds times as high as the doping concentration. If the second n-type region 6 is doped more heavily, the restriction on electron conduction from the existence of the buried insulator region 5 will be suppressed and the influences of the buried insulator region 5 on $R_{mod2}$ will be reduced.

On the other hand, due to the provision of buried insulator region 5, the number of the holes, which have been injected to the first n-type region 7 and the second n-type region 6, decreases, increasing $R_{Mod1}$ and $R_{CHole}$. For compensating the increasing $R_{Mod1}$ and $R_{CHole}$, the first n-type region 7 is doped more heavily so that $R_{DJFETNeck}$ may be decreased. In association with decreasing $R_{DJFETNeck}$, the device pitch is narrowed and the channel density is increased to decrease $R_{CElectron}$. Under these provisions, the low on-resistance, the low on-voltage and the high saturation current can be maintained, even if the emitter hole current decreases.

Since the second n-type region 6 works as a middle buffer layer, the second n-type drift region 6 is depleted, in the turning-off of the device according to the first embodiment, more slowly than the second n-type drift region in the conventional device exhibiting the same breakdown voltage with that of the device according to the first embodiment. (In the conventional device exhibiting the same breakdown voltage with that of the device according to the first embodiment, the first n-type region, the second n-type region and the n⁻-type drift layer are doped equally to first n-type region 7, second n-type region 6 and n⁻-type drift layer 3.) Since the electric field strength in the vicinity of n-type buffer layer 2 is weakened by depleting the second n-type drift region 6 more slowly, soft tuning-off is realized.

Now the functions of p-type region 4 will be described. If a voltage is applied to collector electrode 18 while the device is in the OFF-state thereof, the depletion layer is prevented from expanding into the drift region 3 from the boundary between first n-type region 7 and p-type body region 8 due to the provision of buried insulator region 5. If any p-type region 4 is not disposed, the breakdown voltage will be lower than the breakdown voltage of the device not including any buried insulator region 5. In contrast, since it becomes easier to deplete n⁻-type drift layer 3 by disposing p-type region 4, with the conductivity type thereof opposite to the conductivity type of n⁻-type drift layer 3, a high breakdown voltage is secured. Although not specific to the IGBT according to the first embodiment, an OFF breakdown voltage of, for example, 500 V is obtained.

Figure 3:
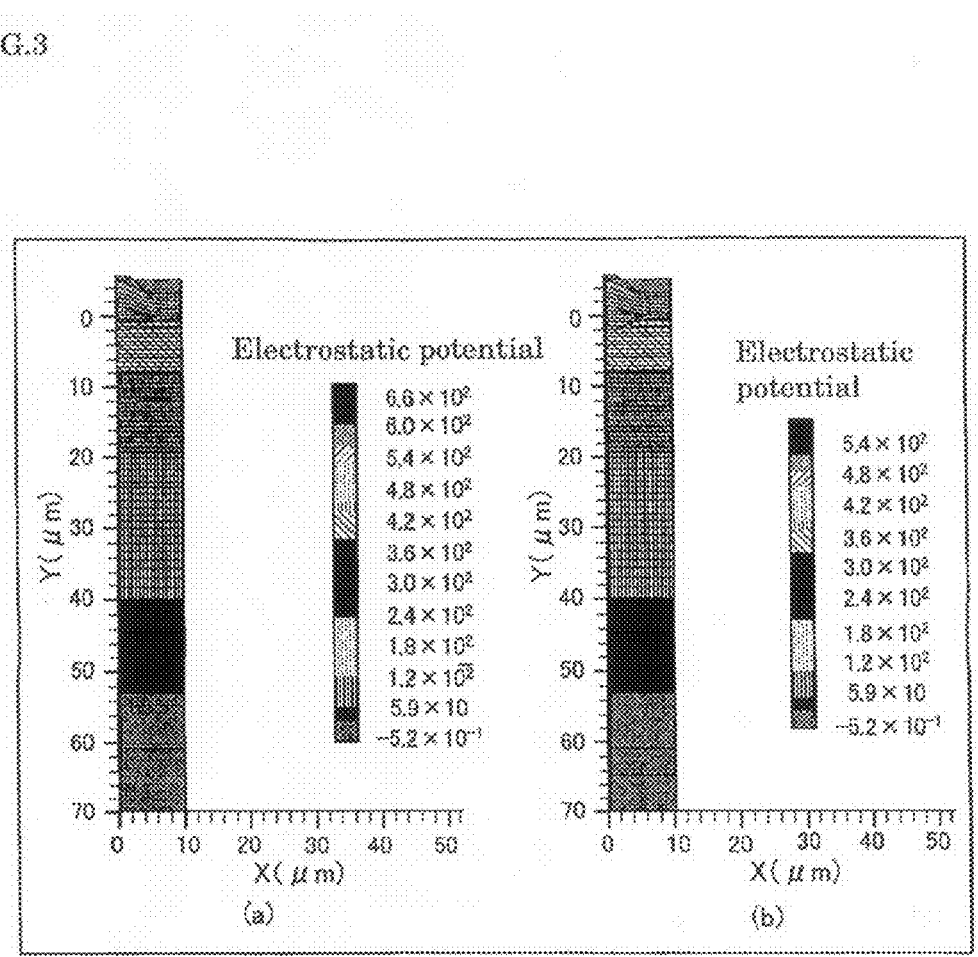
FIG. 3 is a pair of graphs for explaining the internal electrostatic potential distributions when breakdown is caused in the OFF-state of the devices.
Figure 4:
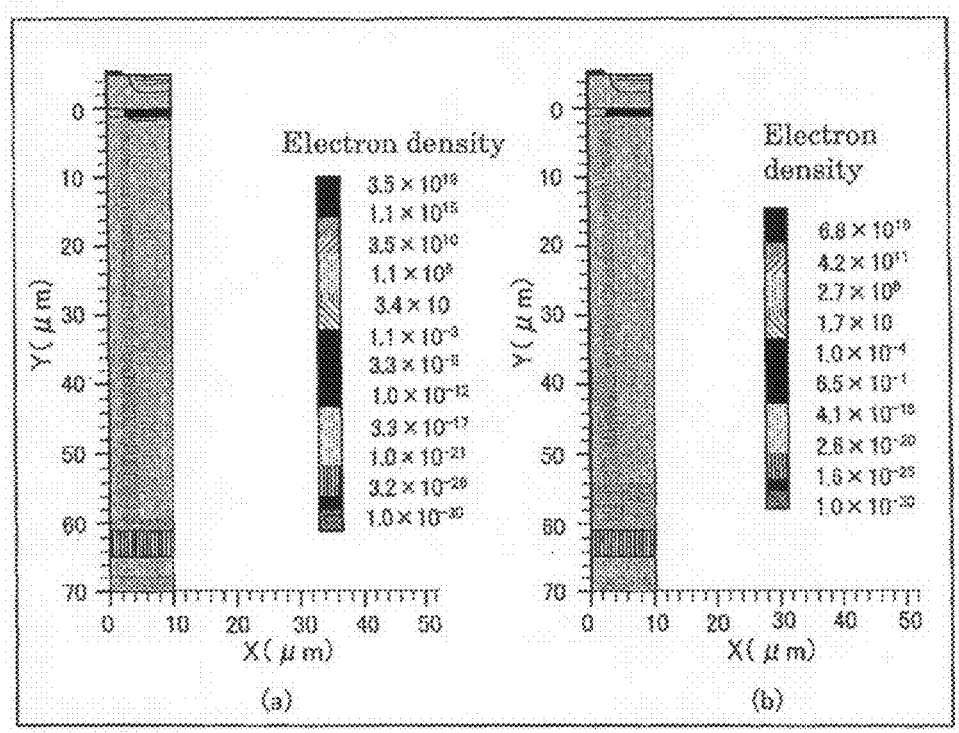
FIG. 4 is a pair of graphs for explaining the internal electron concentration distributions when breakdown is caused in the OFF-state of the devices.

The present inventors have conducted the following verifications. FIGS. 3 and 4 describe the verification results. The internal electrostatic potential distributions when breakdown is caused in the OFF-state of the device including p-type region 4 (hereinafter referred to as the "device (a)") are described in (a) of FIG. 3. The internal electrostatic potential distributions when breakdown is caused in the OFF-state of the device not including any p-type region 4 (hereinafter referred to as the "device (b)") are described in (b) of FIG. 3. In FIGS. 3 and 4, X=0 μm on the left hand side edge of FIG. 1 and Y=0 μm on the surface of buried insulator region 5. The device (a) is different from the device (b) only in that the device (a) includes p-type region 4 but the device (b) does not. The other device parameters are the same for the devices (a) and (b).

For example, the doping concentration and the thickness are $2\times10^{20}$ cm⁻³ and 5 μm, respectively, for p⁺-type collector layer 1a. The doping concentration and the thickness are $5\times10^{16}$ cm⁻³ and 4 μm, respectively, for n-type buffer layer 2. The doping concentration and the thickness are $2\times10^{14}$ cm⁻³ and 60 μm, respectively, for n⁻-type drift layer 3. The doping concentration and the thickness are $1\times10^{17}$ cm⁻³ and 1 μm, respectively, for p-type region 4.

The doping concentration and the opening width of the second n-type region 6 (the contact area width between the second n-type region 6 and the first n-type region 7) are $2\times10^{14}$ cm⁻³ and 3 μm, respectively. Buried insulator region 5 is 1 μm in thickness. The doping concentration and the thickness are $2\times10^{14}$ cm⁻³ and 5 μm, respectively, for the first n-type region 7. The doping concentration in the boundary between p-type body region 8 and gate oxide film 10 is from $1\times10^{17}$ cm⁻³ to $2\times10^{17}$ cm⁻³. Gate oxide film 10 is 20 nm in thickness. The spacing between p-type region 4 and the second n-type region 6 is 1 μm.

The breakdown voltage is 654 V for the device (a) and 568 V for the device (b). In other words, the provision of p-type region 4 facilitates realizing a higher breakdown voltage. FIG. 4 is a pair of graphs for explaining the internal electron concentration distributions when breakdown is caused in the OFF-state of the devices. The internal electron concentration distributions when breakdown is caused in the OFF-state of the device including p-type region 4 (device (a)) are described in (a) of FIG. 4. The internal electrostatic potential distributions when breakdown is caused in the OFF-state of the device not including any p-type region 4 (device (b)) are described in (b) of FIG. 4. Comparing the results described in (a) and (b) of FIG. 4, the device is depleted more easily by the provision of p-type region 4.

Although the thermal conductivity of buried insulator region 5 is low, buried insulator region 5 is not extended across the drift region. Therefore, the heat generated in the channel region or in the first n-type region 7 is conducted to n-type buffer layer 2 via the second n-type region 6 and n⁻-type drift layer 3 and, then, dissipated to p⁺-type collector layer 1a, that is to the semiconductor substrate. Therefore, the device according to the first embodiment exhibits the temperature characteristics similar to the temperature characteristics of the bulk device that does not include any SOI structure.

According to the first embodiment, an IGBT, which exhibits excellent thermal properties, a high breakdown voltage, a high current driving capability and a high latch up withstanding capability, is obtained. According to the first embodiment, an IGBT, the on-resistance and the on-voltage thereof are low, is also obtained. By employing a partial SOI structure, an IGBT is obtained with low manufacturing costs, since it is not necessary to use any expensive SOI wafer.

Figure 5:
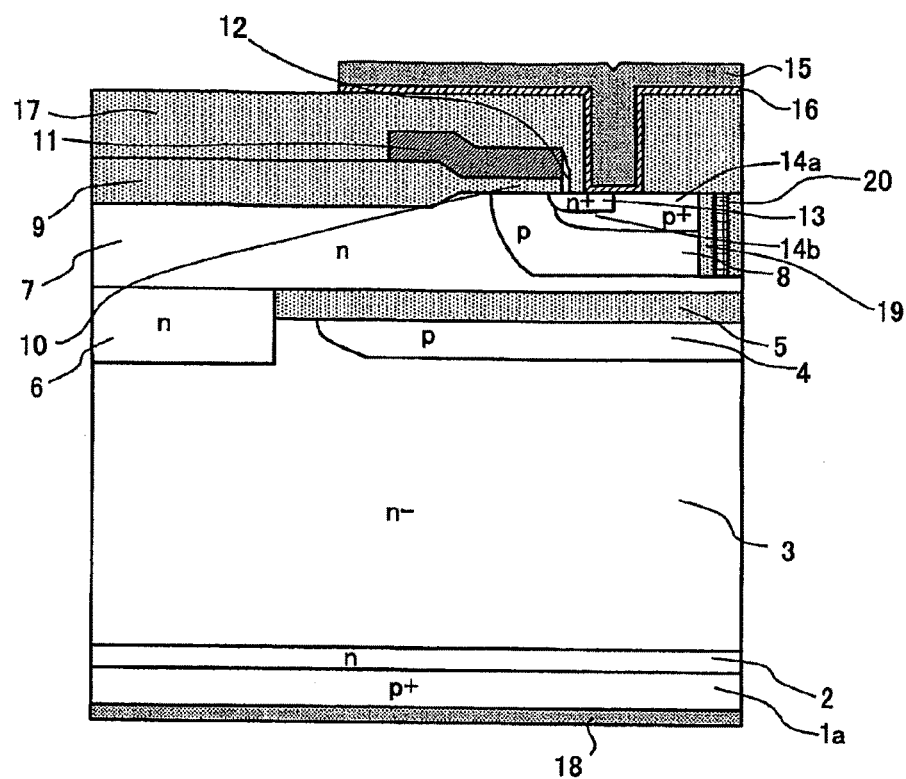
FIG. 5 is a cross sectional view of a semiconductor device having a modified structure according to the first embodiment of the invention.

As shown in FIG. 5, polysilicon gate electrode 11 may be shortened and disposed locally on LOCOS oxide film 9. And, emitter electrode 15 and emitter barrier layer 16 may be shortened and disposed locally on interlayer insulator film 17. The structure described above is suited for the application that requires high-speed operations, since the Miller capacitance and the capacitance Cgs between the gate and the source are reduced. When a high Miller capacitance poses no problem, the lower surface of the shortened polysilicon gate electrode 11 may be covered entirely with gate oxide film 10.

Second Embodiment

Figure 6:
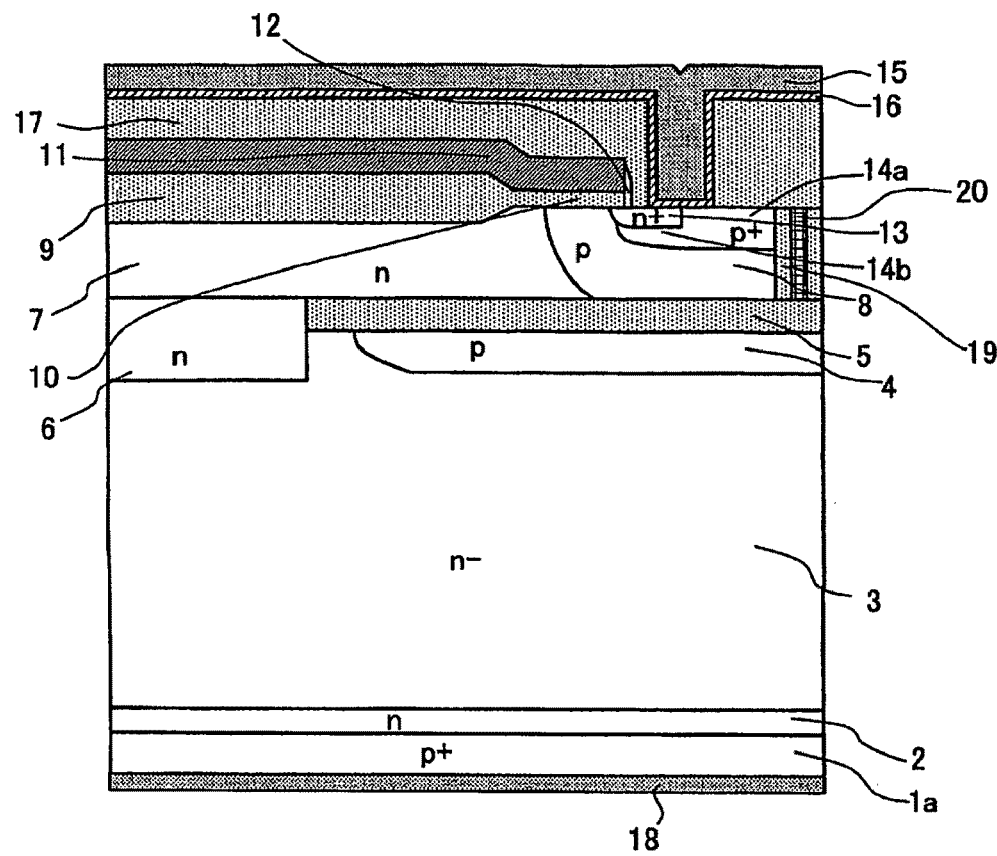
FIG. 6 is a cross sectional view of a semiconductor device according to a second embodiment of the invention.
Figure 7:
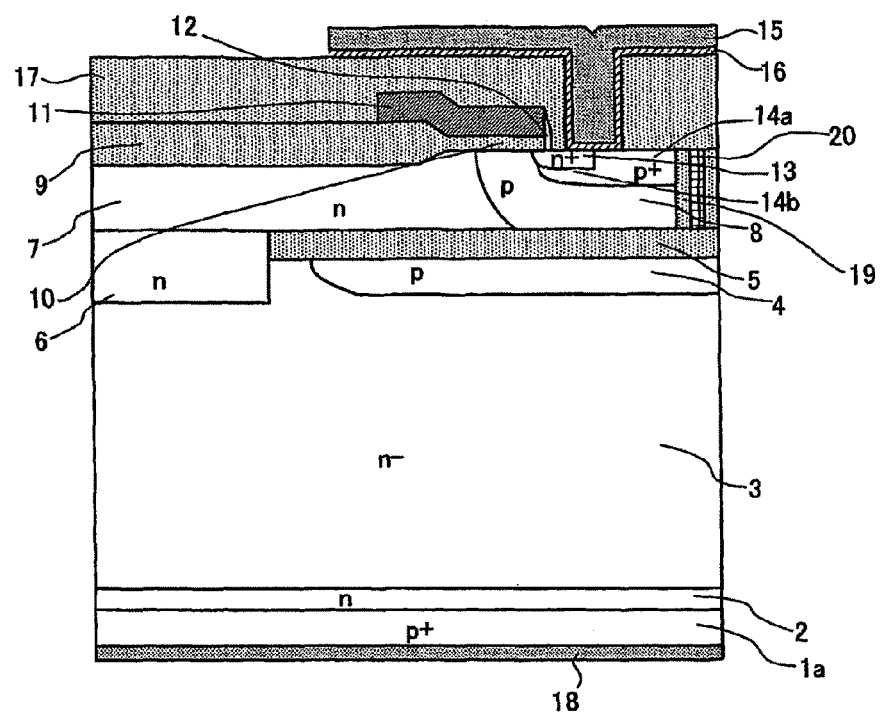
FIG. 7 is a cross sectional view of a semiconductor device having a modified structure according to the second embodiment of the invention.

FIG. 6 is a cross sectional view of an IGBT according to a second embodiment of the invention. Referring now to FIG. 6, p-type body region 8, which is spaced apart from buried insulator region 5 in the IGBT according to the first embodiment, is in contact with buried insulator region 5 in the IGBT according to the second embodiment. The other configurations in the IGBT according to the second embodiment are the same with the configurations in the IGBT according to the first embodiment. The structure according to the second embodiment is suited for the thin film devices, in which the semiconductor layer on buried insulator region 5, that is the first n-type region 7, is 1 μm or less in thickness. For applying the structure according to the second embodiment to the IGBTs, for which high-speed operations are required, it is effective to decrease the Miller capacitance and the capacitance Cgs between the gate and the source by shortening polysilicon gate electrode 11, emitter electrode 15 and emitter barrier layer 16 as shown in FIG. 7.

Third Embodiment

Figure 8:
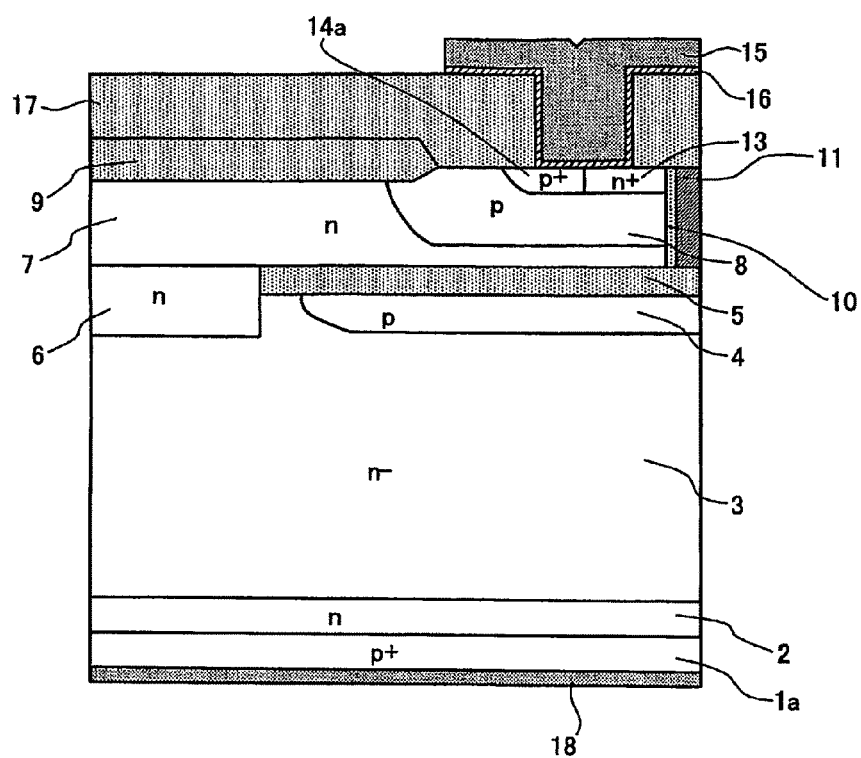
FIG. 8 is a cross sectional view of a semiconductor device according to a third embodiment of the invention.

FIG. 8 is a cross sectional view of an IGBT according to a third embodiment of the invention. Referring now to FIG. 8, the planar gate structure in the IGBT according to the first embodiment is replaced by a trench gate structure in the IGBT according to the third embodiment. The trench gate structure is formed in the location of the IGBT, in which the trench separation structure is formed according to the first embodiment. The n$^+$-type emitter region 13 is formed in adjacent to the trench gate structure. Since this structure makes it hard for the parasitic thyristor to work, the latch-up withstanding capability is improved. The other configurations according to the third embodiment are the same with the configurations according to the first embodiment. As illustrated in FIG. 8, p$^+$-type buried low-resistance region 14b and gate-side-wall spacer film 12 are not disposed.

Fourth Embodiment

Figure 9:
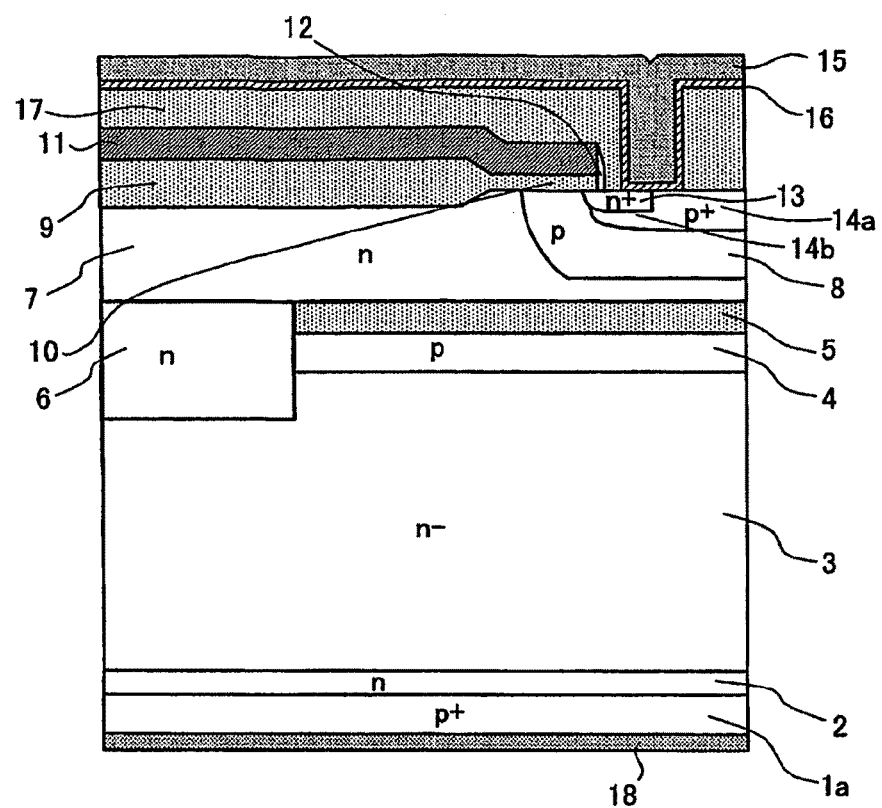
FIG. 9 is a cross sectional view of a semiconductor device according to a fourth embodiment of the invention.
Figure 10:
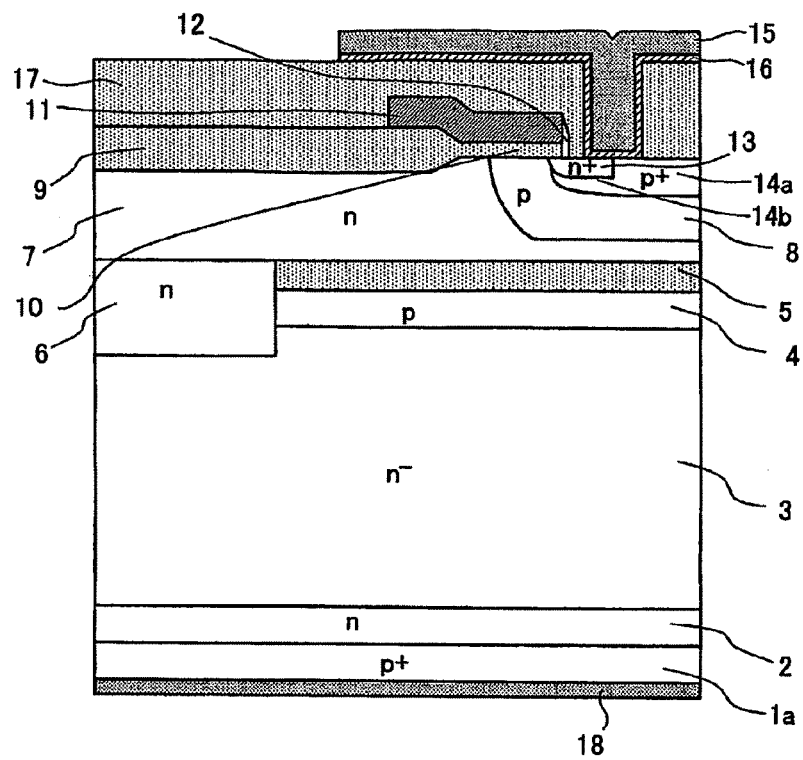
FIG. 10 is a cross sectional view of a semiconductor device having a modified structure according to the fourth embodiment of the invention.

FIG. 9 is a cross sectional view of an IGBT according to a fourth embodiment of the invention. Referring now to FIG. 9, the IGBT according to the fourth embodiment omits the trench separation structure from the IGBT according to the first embodiment. The p-type region 4 in contact with the second n-type region 6 in FIG. 9 may be spaced apart from the second n-type region 6 in the same manner as in the IGBT according to the first embodiment. The other configurations according to the fourth embodiment are the same with the configurations according to the first embodiment. For applying the structure according to the fourth embodiment to the IGBTs, for which high-speed operations are required, it is effective to decrease the Miller capacitance and the capacitance Cgs between the gate and the source by shortening polysilicon gate electrode 11, emitter electrode 15 and emitter barrier layer 16 as shown in FIG. 10.

Fifth Embodiment

Figure 11:
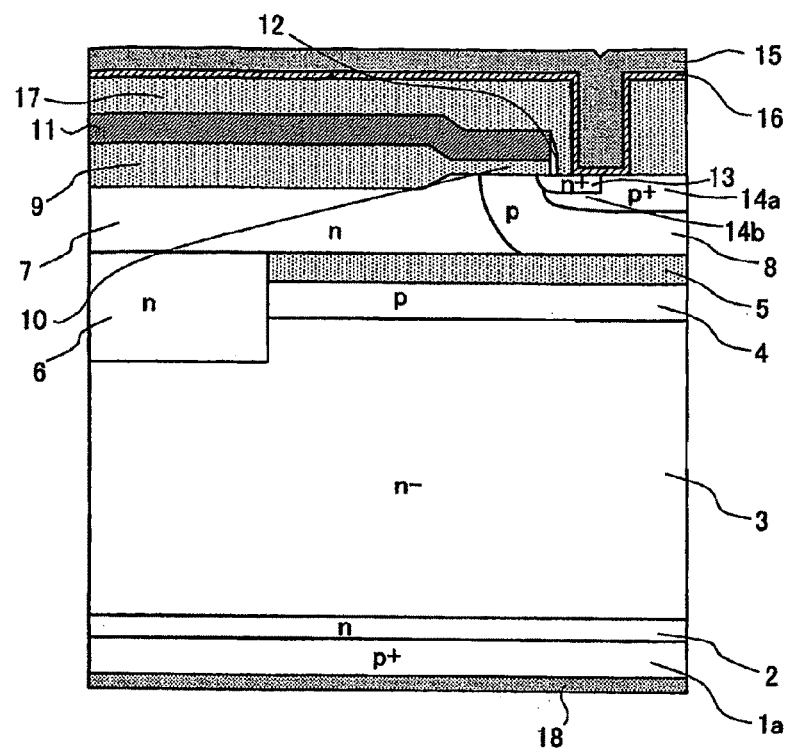
FIG. 11 is a cross sectional view of a semiconductor device according to a fifth embodiment of the invention.
Figure 12:
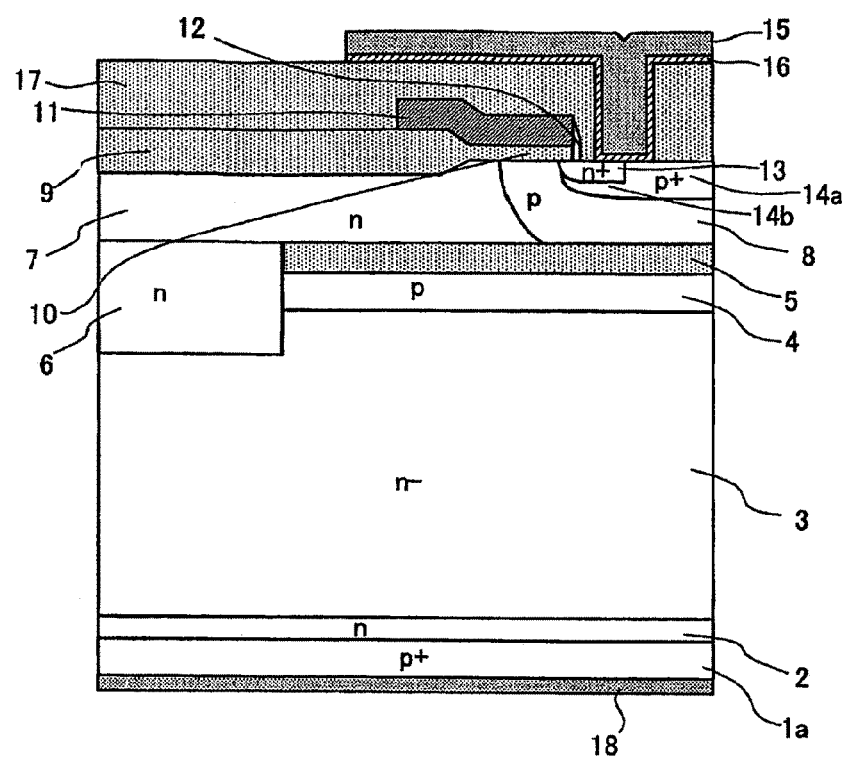
FIG. 12 is a cross sectional view of a semiconductor device having a modified structure according to the fifth embodiment of the invention.

FIG. 11 is a cross sectional view of an IGBT according to a fifth embodiment of the invention. Referring now to FIG. 11, the IGBT according to the fifth embodiment omits the trench separation structure from the IGBT according to the second embodiment. The p-type region 4 in contact with the second n-type region 6 in FIG. 11 may be spaced apart from the second n-type region 6 in the same manner as in the IGBT according to the second embodiment. The other configurations according to the fifth embodiment are the same with the configurations according to the second embodiment. For applying the structure according to the fifth embodiment to the IGBTs, for which high-speed operations are required, it is effective to decrease the Miller capacitance and the capacitance Cgs between the gate and the source by shortening polysilicon gate electrode 11, emitter electrode 15 and emitter barrier layer 16 as shown in FIG. 12.

Sixth Embodiment

Figure 13:
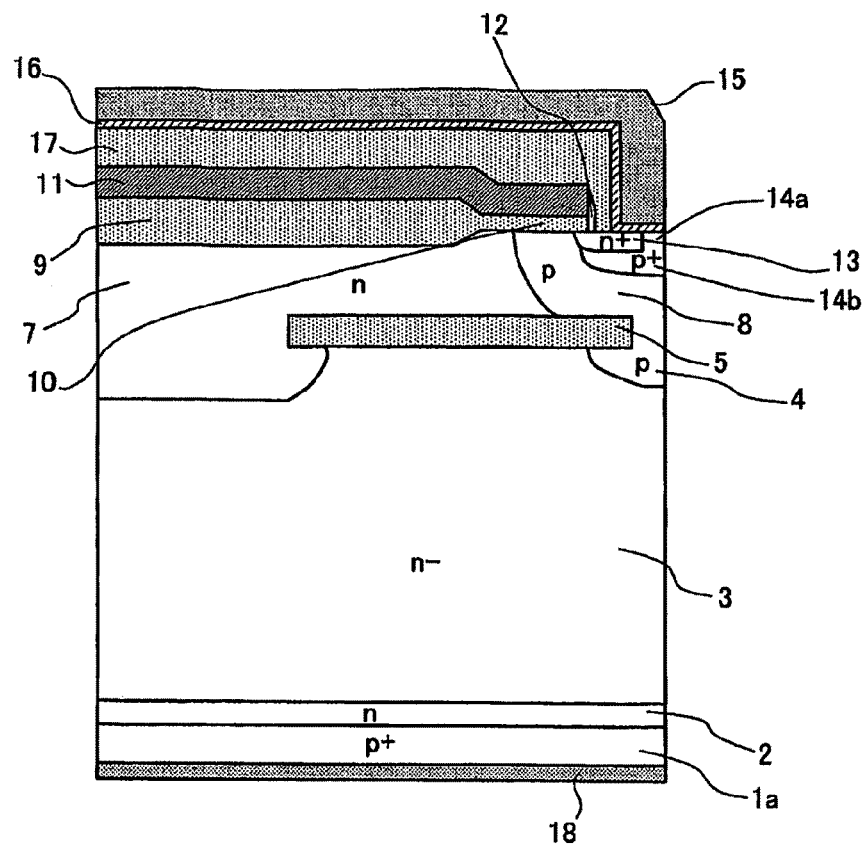
FIG. 13 is a cross sectional view of a semiconductor device according to a sixth embodiment of the invention.

FIG. 13 is a cross sectional view of an IGBT according to a sixth embodiment of the invention. Referring now to FIG. 13, the IGBT according to the sixth embodiment omits second n-type region 6 from the IGBT according to the fifth embodiment and the first n-type region 7 is expanded to the location, therein n-type region 6 is in the IGBT according to the fifth embodiment. Buried insulator region 5 is terminated below n$^+$-type emitter region 13. (Hereinafter the edge of buried insulator region 5 below n$^+$-type emitter region 13 will be referred to as the "first edge".) On the first edge of buried insulator region 5, p-type body region 8 and p-type region 4 are connected to each other. Therefore, p-type region 4 and p-type body region 8 are integrated into a unit such that p-type region 4 is not in the floating state electrically.

Although not limited to the illustrated example, p-type region 4 is not extended, below buried insulator region 5, to the vicinity of the other edge (hereinafter referred to as the "second edge") of buried insulator region 5 in FIG. 13. In other words, p-type region 4 and p-type body region 8 cover the first edge of buried insulator region 5 a little. Therefore, the contact area between buried insulator region 5 and n$^-$-type drift layer 3 in the IGBT according to the sixth embodiment is wider than that in the IGBT according to the fifth embodiment. The other configurations according to the sixth embodiment are the same with the configurations according to the fifth embodiment.

Figure 14:
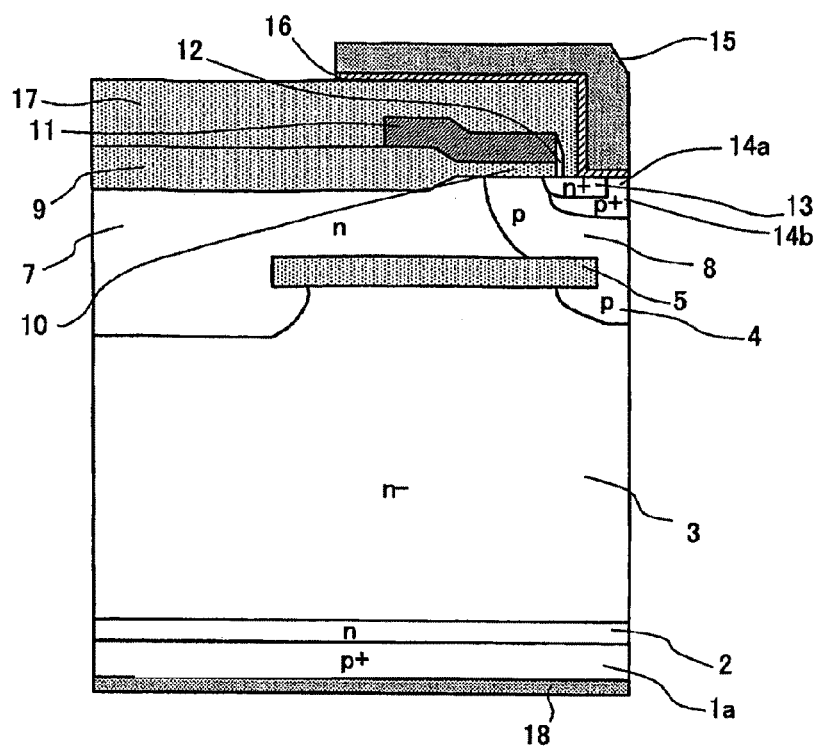
FIG. 14 is a cross sectional view of a semiconductor device having a modified structure according to the sixth embodiment of the invention.
Figure 62:
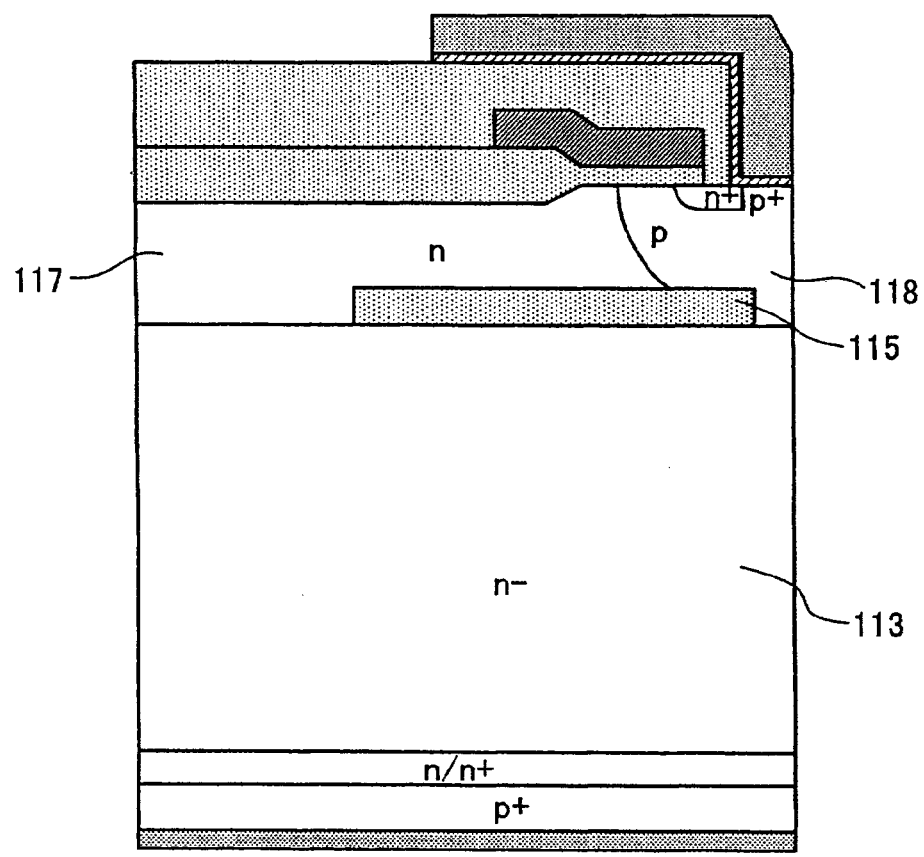
FIG. 62 is a cross sectional view of a vertical IGBT having a conventional partial SOI structure.

Since p-type region 4 is below buried insulator region 5 according to the sixth embodiment, n$^-$-type drift layer 3 in the IGBT according to the sixth embodiment is depleted more easily when a reverse bias voltage is applied than the n$^-$-type drift layer in the conventional device shown in FIG. 62. Therefore, a higher breakdown voltage is obtained according to the sixth embodiment. For applying the structure according to the sixth embodiment to the IGBTs, for which high-speed operations are required, it is effective to decrease the Miller capacitance and the capacitance Cgs between the gate and the source by shortening polysilicon gate electrode 11, emitter electrode 15 and emitter barrier layer 16 as shown in FIG. 14. For applying the structure according to the sixth embodiment to the IGBTs, if the latch-up withstanding capability thereof is not required to be so high, gate-side-wall spacer film 12 and p$^+$-type buried low-resistance region 14b may not be disposed with no problem in the same manner as in the IGBTs according to the first through fifth embodiments.

If necessary, an additional p-type region 4 same as those described in connection with the IGBTs according first through fifth embodiments may be formed between buried insulator region 5 and n$^-$-type drift layer 3 with no problem. Additional p-type region 4 formed as described above may be floated or connected to p-type region 4.

Seventh Embodiment

Figure 15:
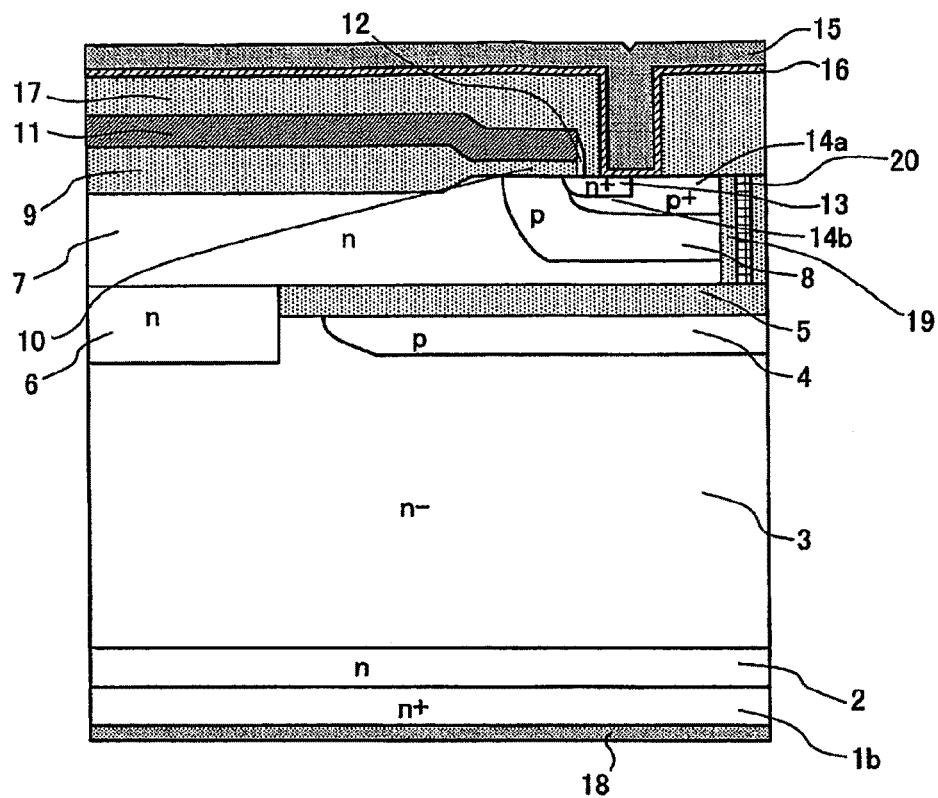
FIG. 15 is a cross sectional view of a semiconductor device according to a seventh embodiment of the invention.

FIG. 15 is a cross sectional view of a semiconductor device according to a seventh embodiment of the invention. Referring now to FIG. 15, the semiconductor device according to the seventh embodiment has a MOSFET structure formed by replacing p$^+$-type collector layer 1a according to the first embodiment with an n$^+$-type drain layer 1b (low-resistance layer). The other configurations according to the seventh embodiment are the same with the configurations according to the first embodiment. Although FIG. 15 shows the MOSFET structure corresponding to the structure shown in FIG. 1, the semiconductor device according to the seventh embodiment may have a MOSFET structure corresponding to the structure shown in FIG. 5.

Eighth Embodiment

Figure 16:
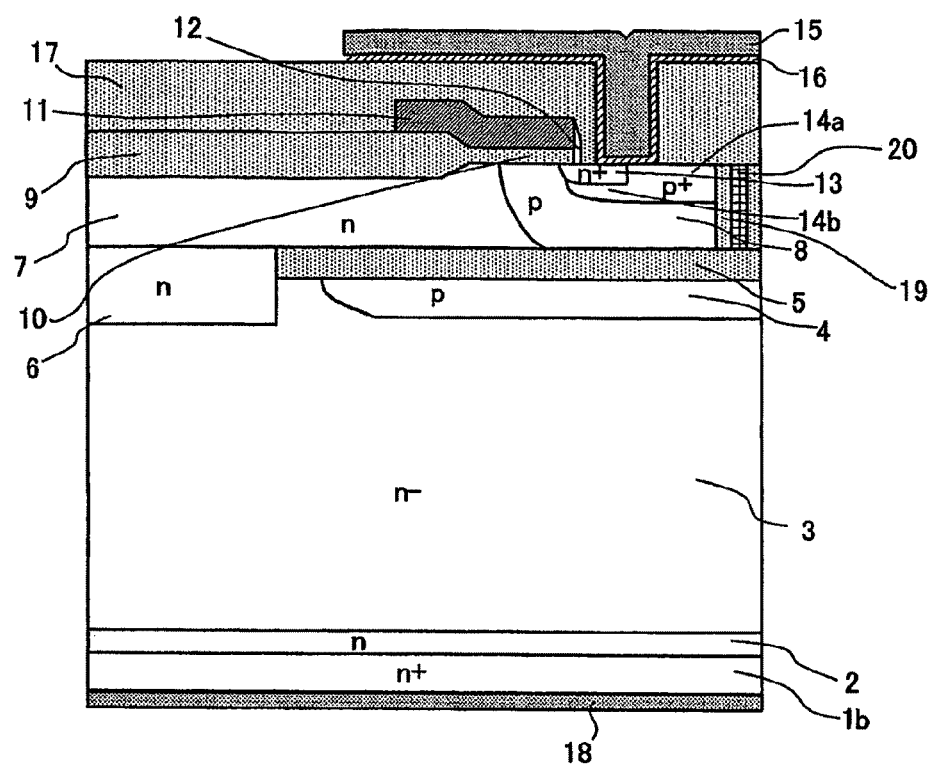
FIG. 16 is a cross sectional view of a semiconductor device according to an eighth embodiment of the invention.

FIG. 16 is a cross sectional view of a semiconductor device according to an eighth embodiment of the invention. Referring now to FIG. 16, the semiconductor device according to the eighth embodiment has a MOSFET structure formed by replacing p$^+$-type collector layer 1a according to the second embodiment with n$^+$-type drain layer 1b. The other configurations according to the eighth embodiment are the same with the configurations according to the second embodiment. Although FIG. 16 shows the MOSFET structure corresponding to the structure shown in FIG. 7, the semiconductor device according to the seventh embodiment may have a MOSFET structure corresponding to the structure shown in FIG. 6.

Ninth Embodiment

Figure 17:
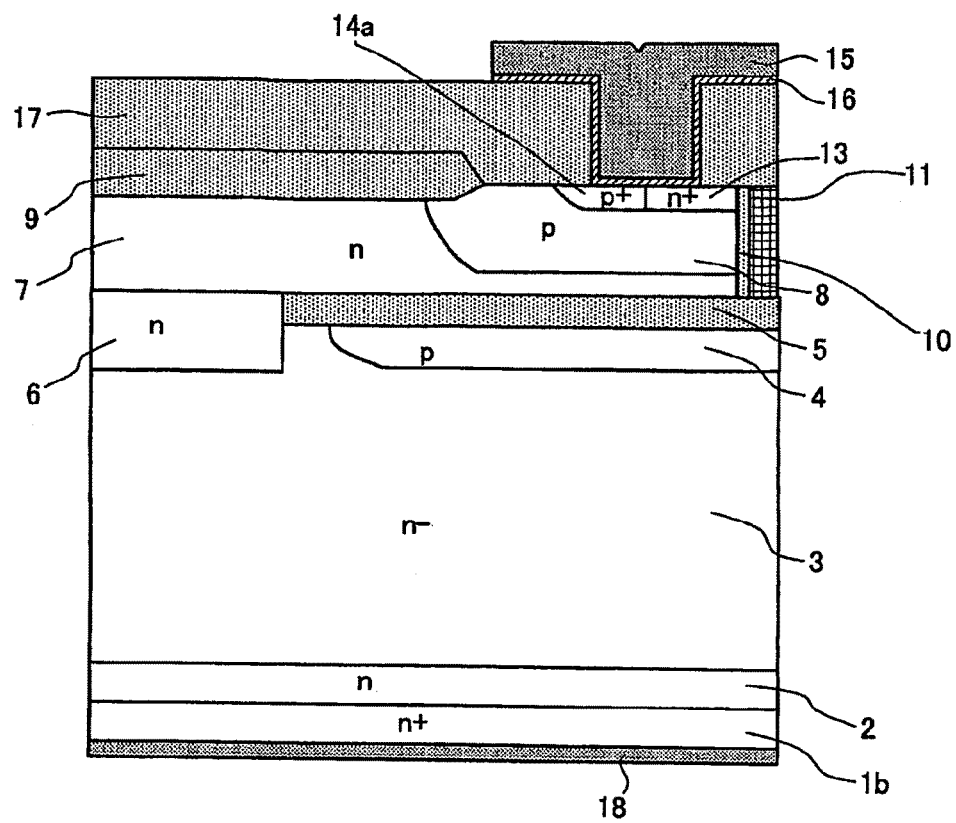
FIG. 17 is a cross sectional view of a semiconductor device according to a ninth embodiment of the invention.

FIG. 17 is a cross sectional view of a semiconductor device according to a ninth embodiment of the invention. Referring now to FIG. 17, the semiconductor device according to the ninth embodiment has a MOSFET structure formed by replacing p⁺-type collector layer 1a according to the third embodiment with n⁺-type drain layer 1b. The other configurations according to the ninth embodiment are the same with the configurations according to the third embodiment.

Tenth Embodiment

Figure 18:
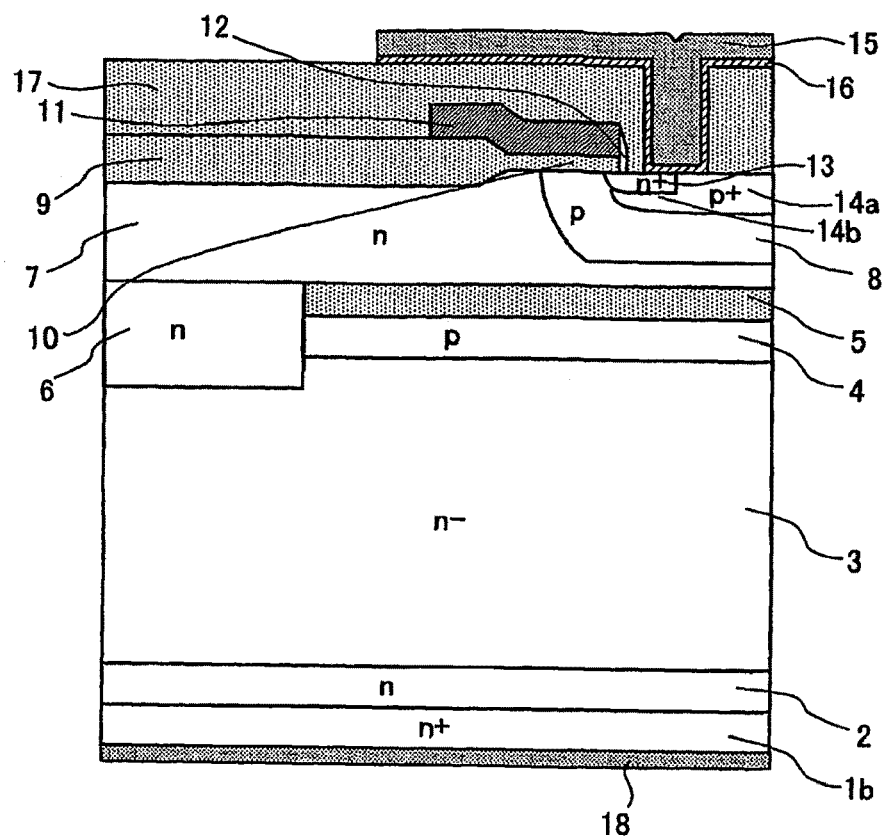
FIG. 18 is a cross sectional view of a semiconductor device according to a tenth embodiment of the invention.

FIG. 18 is a cross sectional view of a semiconductor device according to a tenth embodiment of the invention. Referring now to FIG. 18, the semiconductor device according to the tenth embodiment has a MOSFET structure formed by replacing p⁺-type collector layer 1a according to the fourth embodiment with n⁺-type drain layer 1b. The other configurations according to the tenth embodiment are the same with the configurations according to the fourth embodiment. Although FIG. 18 shows the MOSFET structure corresponding to the structure shown in FIG. 10, the semiconductor device according to the tenth embodiment may have a MOSFET structure corresponding to the structure shown in FIG. 9.

Eleventh Embodiment

Figure 19:
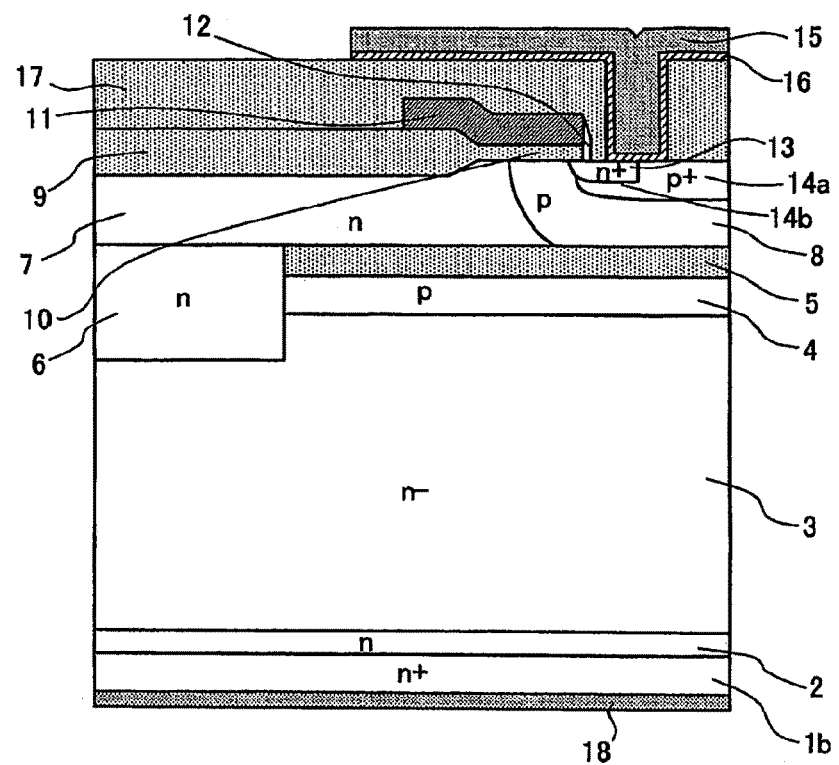
FIG. 19 is a cross sectional view of a semiconductor device according to an eleventh embodiment of the invention.

FIG. 19 is a cross sectional view of a semiconductor device according to an eleventh embodiment of the invention. Referring now to FIG. 19, the semiconductor device according to the eleventh embodiment has a MOSFET structure formed by replacing p⁺-type collector layer 1a according to the fifth embodiment with n⁺-type drain layer 1b. The other configurations according to the eleventh embodiment are the same with the configurations according to the fifth embodiment. Although FIG. 19 shows the MOSFET structure corresponding to the structure shown in FIG. 12, the semiconductor device according to the eleventh embodiment may have a MOSFET structure corresponding to the structure shown in FIG. 11.

Twelfth Embodiment

Figure 20:
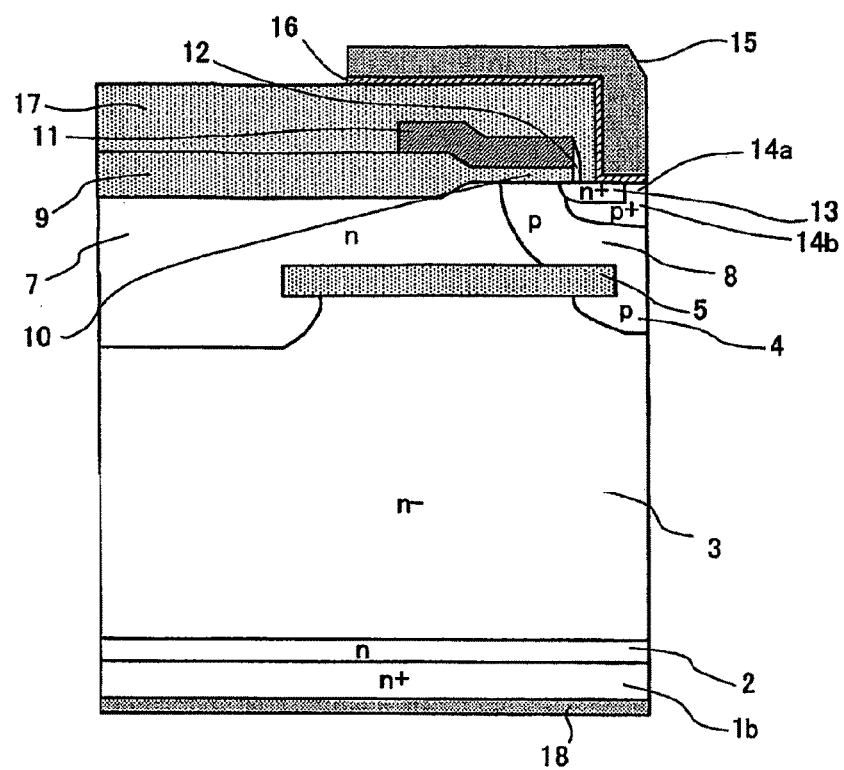
FIG. 20 is a cross sectional view of a semiconductor device according to a twelfth embodiment of the invention.

FIG. 20 is a cross sectional view of a semiconductor device according to a twelfth embodiment of the invention. Referring now to FIG. 20, the semiconductor device according to the twelfth embodiment has a MOSFET structure formed by replacing p⁺-type collector layer 1a according to the sixth embodiment with n⁺-type drain layer 1b. The other configurations according to the twelfth embodiment are the same with the configurations according to the sixth embodiment. Although FIG. 20 shows the MOSFET structure corresponding to the structure shown in FIG. 14, the semiconductor device according to the twelfth embodiment may have a MOSFET structure corresponding to the structure shown in FIG. 13.

Thirteenth Embodiment

Figure 21:
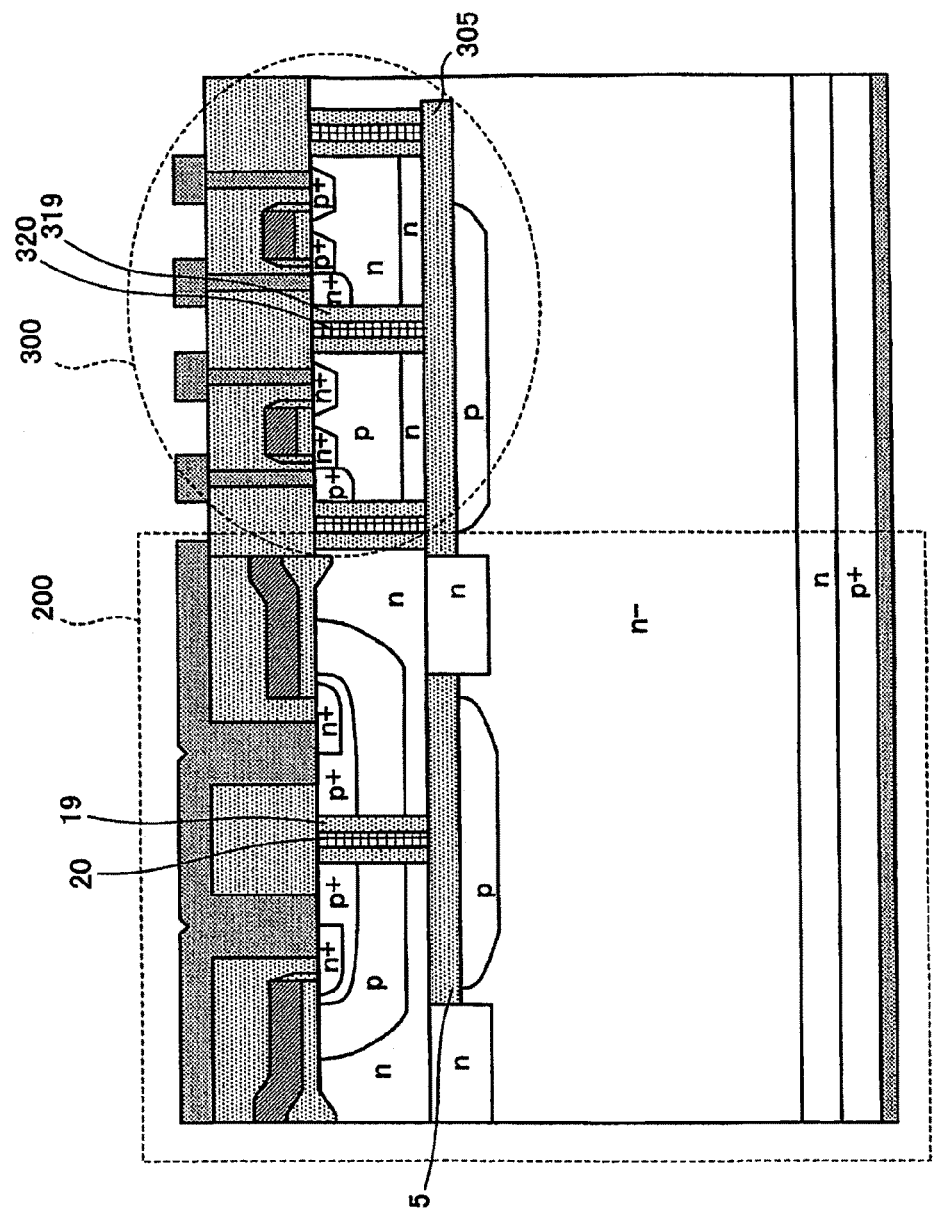
FIG. 21 is a cross sectional view of a semiconductor device according to a thirteenth embodiment of the invention.

FIG. 21 is a cross sectional view of a semiconductor device according to a thirteenth embodiment of the invention. Referring now to FIG. 21, the semiconductor device according to the thirteenth embodiment mounts an IGBT 200 according to the first embodiment (in a square area surrounded by broken lines) and a low-voltage lateral NMOS transistor 300 (in an elliptical area surrounded by a broken curve), which is a low-voltage control device for controlling IGBT 200, integrated on a semiconductor substrate.

Low-voltage lateral NMOS transistor 300 is fabricated in a region surrounded by a buried insulator region 305 similar to buried insulator region 5 of IGBT 200 and a trench separation structure formed of silicon oxide separation films 319 and a polysilicon buried layer 320 and similar to the trench separation structure of IGBT 200 formed of silicon oxide separation film 19 and polysilicon buried layer 20. In other words, low-voltage lateral NMOS transistor 300 is a perfect SOI device separated completely from the other devices dielectrically.

Figure 60:
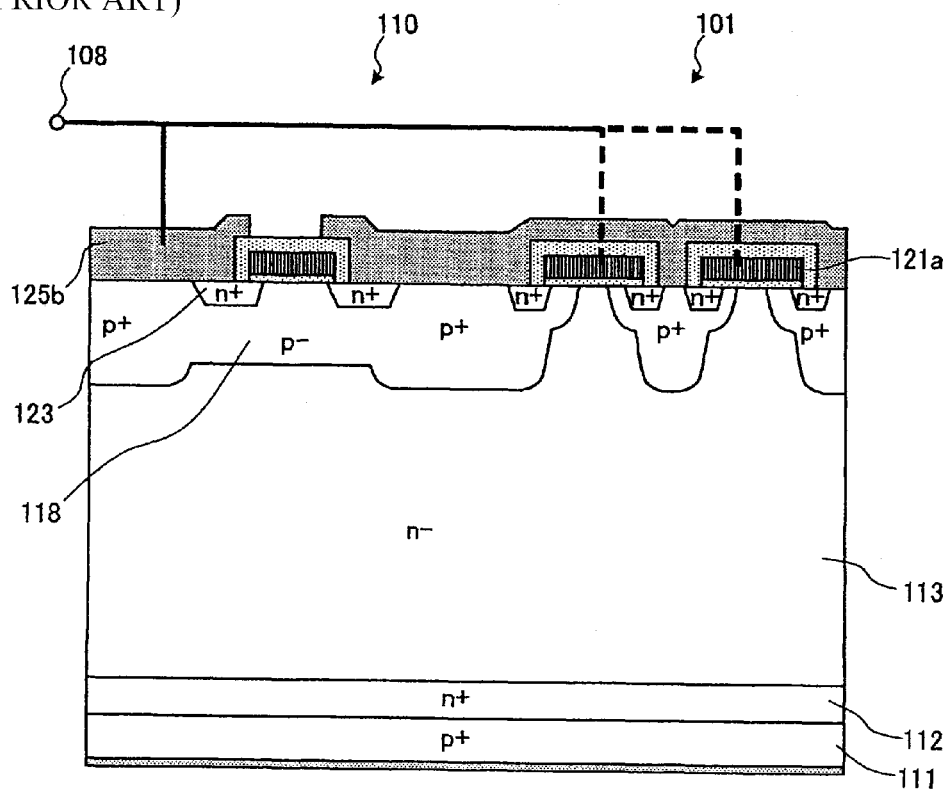
FIG. 60 is a cross sectional view showing the integrated structure of a vertical IGBT and a low-voltage lateral NMOS transistor.
Figure 61:
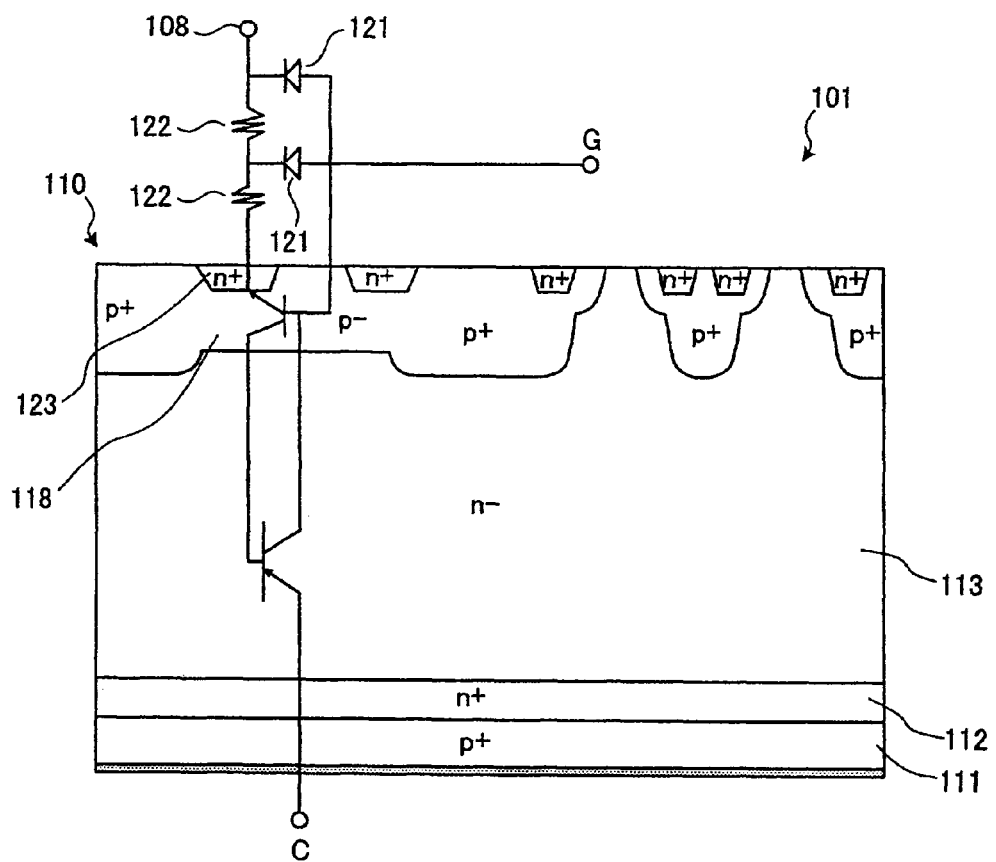
FIG. 61 is a cross sectional view schematically showing the thyristor parasitic on the integrated structure shown in FIG. 60.

Since the parasitic thyristor (cf. FIG. 61) parasitic on the integrated structure of the conventional IGBT and the conventional NMOS transistor (cf. FIG. 60) is not caused in the structure according to the thirteenth embodiment, any latch-up is not caused even when a negative input signal is fed to the intelligent IGBT gate. Since the short-comings caused by integrating an IGBT and a control IC device into a unit are gotten rid of by completely separating the control IC device dielectrically, the IGBT and the control IC device may be integrated into a unit easily.

Since the wide-area protecting device (cf. FIG. 61), which has been necessary to prevent parasitic latch-up from occurring in the conventional integrated structure of the IGBT and the NMOS transistor, becomes unnecessary, the similar functions are realized in a smaller chip area. The emitter barrier layer is omitted from the structure shown in FIG. 21. The similar functions are realized in smaller chip area by the structure that integrates the IGBT according to any of the second through sixth embodiments and a low-voltage control device onto a semiconductor substrate or by the structure that integrates the MOSFET according to any of the seventh through twelfth embodiments and a low-voltage control device onto a semiconductor substrate.

Fourteenth Embodiment

Figure 22:
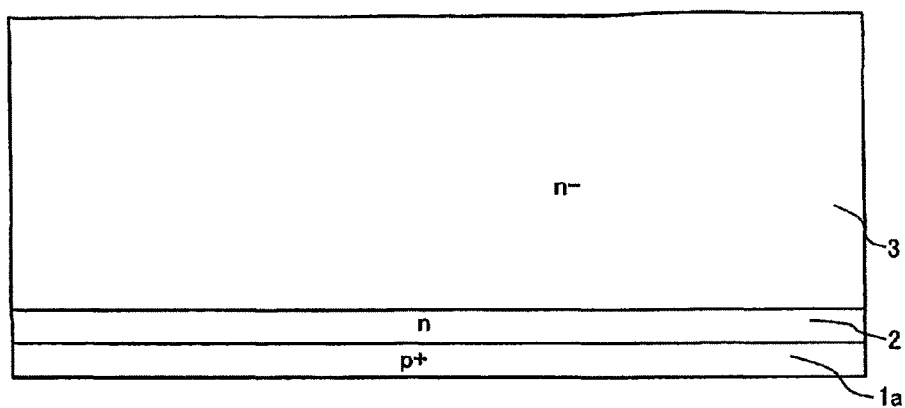
FIG. 22 is a first cross sectional view of a semiconductor device under the manufacture thereof by the manufacturing method according to a fourteenth embodiment of the invention.

Now the manufacturing method according to a fourteenth embodiment of the invention applicable to manufacturing, for example, the semiconductor device according to the first embodiment will be described below. FIGS. 22 through 35 are the cross sectional views of a semiconductor device under the manufacturing thereof by the manufacturing method according to the fourteenth embodiment. Referring now to FIG. 22, an n-type semiconductor is grown epitaxially on a semiconductor substrate, which will be a p⁺-type collector layer 1a, to form an n-type buffer layer 2 and an n⁻-type drift layer 3.

Figure 23:
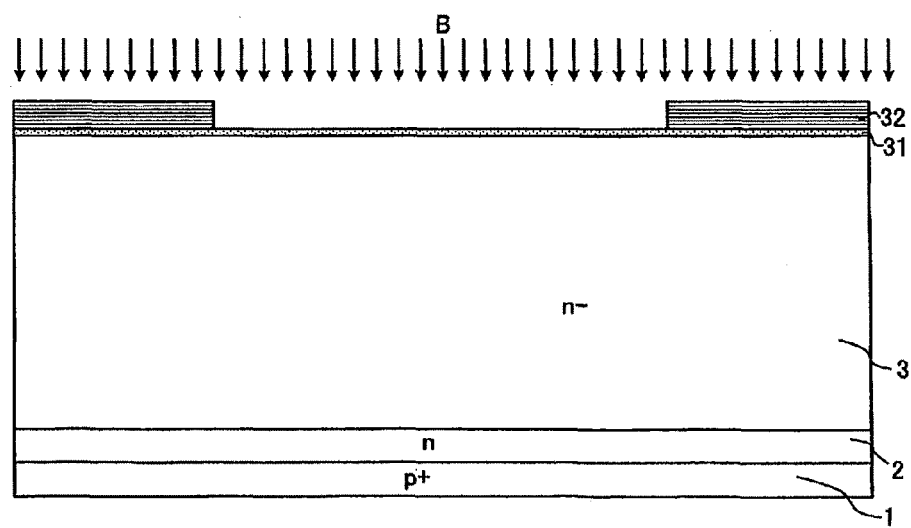
FIG. 23 is a second cross sectional view of the semiconductor device under the manufacture thereof by the manufacturing method according to the fourteenth embodiment of the invention.
Figure 24:
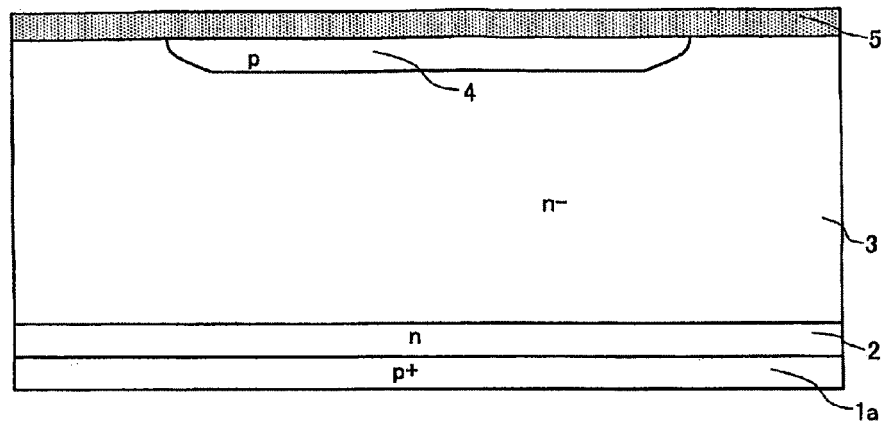
FIG. 24 is a third cross sectional view of the semiconductor device under the manufacture thereof by the manufacturing method according to the fourteenth embodiment of the invention.

Referring now to FIG. 23, the surface of n⁻-type drift layer 3 is oxidized to form a screen oxide film 31 for ion implantation. A photoresist is coated on screen oxide film 31 and the photoresist is patterned by photolithography to form an ion implantation mask 32. Then, boron ions are implanted. Referring now to FIG. 24, the photoresist is removed by oxygen plasma ashing. Screen oxide film 31 is removed after the wafer is cleaned.

Then, a silicon oxide film, which will be a buried insulator region 5, is formed on the surface of n⁻-type drift layer 3 by the thermal oxidation method, by the CVD (chemical vapor deposition) method or by the combination of these methods. While conducting thermal oxidation, a p-type region 4 is formed. The defect density in the boundary between buried insulator region 5 and n⁻-type drift layer 3 and the defect density in the boundary between buried insulator region 5 and p-type region 4 are low due to the thermal oxidation.

Figure 25:
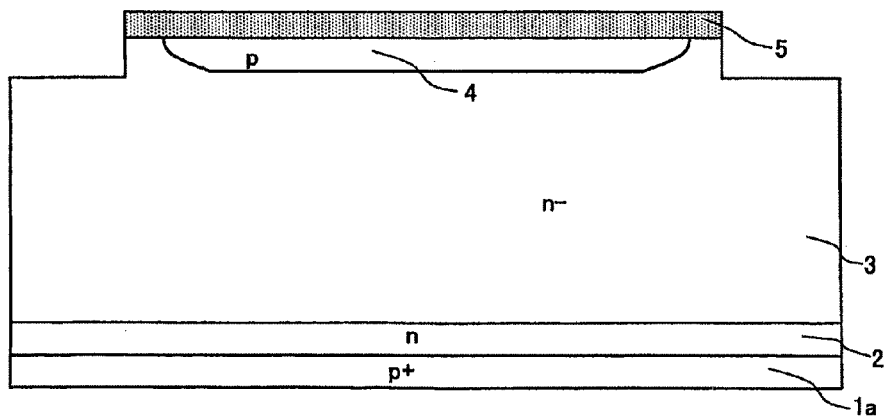
FIG. 25 is a fourth cross sectional view of a semiconductor device under the manufacture thereof by the manufacturing method according to the fourteenth embodiment of the invention.

Referring now to FIG. 25, a photoresist is coated on the silicon oxide film on the wafer surface and an etching mask is formed by patterning the photoresist by photolithography. Then, the silicon oxide film is etched by RIE (reactive ion etching). In the RIE step, silicon in the underlayer, that is n⁻-type drift layer 3, is etched a little bit. Since the over etching is unavoidable, sacrifice oxidation is conducted to remove etching damages.

Figure 26:
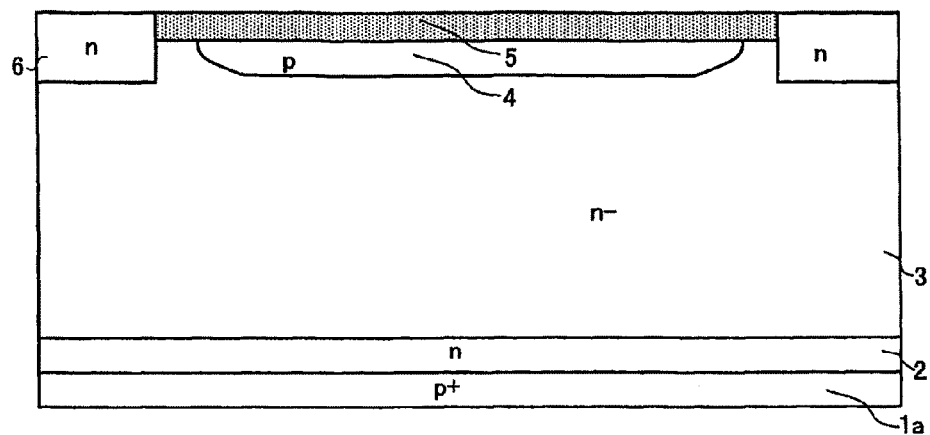
FIG. 26 is a fifth cross sectional view of the semiconductor device under the manufacture thereof by the manufacturing method according to the fourteenth embodiment of the invention.

Referring now to FIG. 26, a second n-type region 6 is grown by selective epitaxy from the surface of n⁻-type drift layer 3 exposed by the RIE as high as the surface level of buried insulator region 5. Since it is necessary to exterminate the stacking faults caused in the boundary between the second n-type region 6 and buried insulator region 5, various measures are taken. For example, low temperature growth is conducted, oxide film rectangular patterns with the sides thereof in the <100> directions are arranged using an (100) substrate, or a CVD nitride film which is low stress with the thermal oxide film, that is, the buried insulator film 5 thereof, is used as the side wall stuff of the buried insulator region 5.

Figure 27:
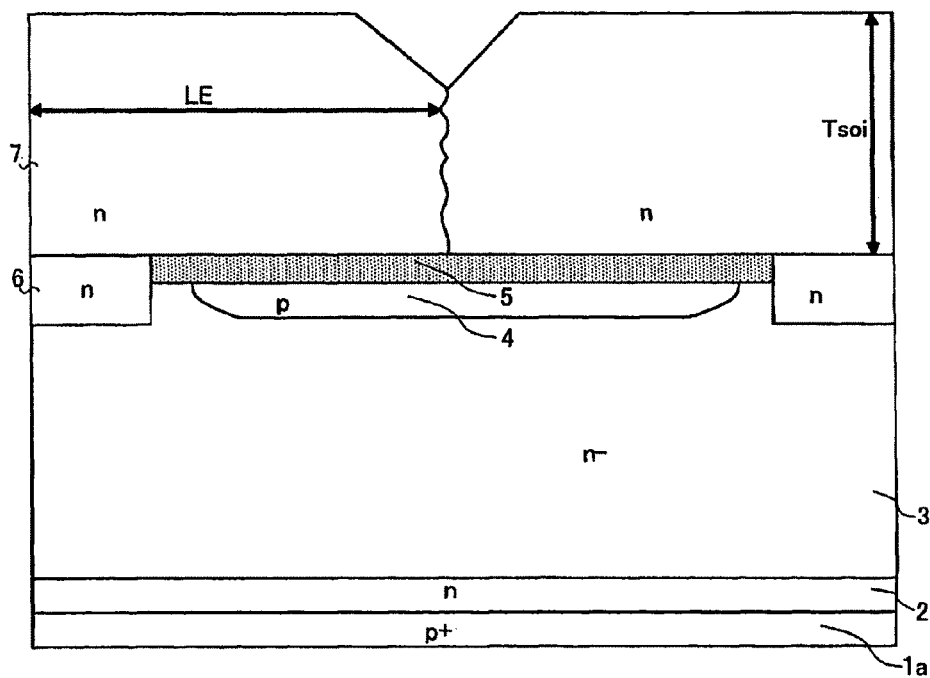
FIG. 27 is a sixth cross sectional view of the semiconductor device under the manufacture thereof by the manufacturing method according to the fourteenth embodiment of the invention.

Referring now to FIG. 27, a first n-type region 7 is formed by lateral selective epitaxial growth. In the lateral selective epitaxial growth, single crystalline silicon is grown as thick as to make the single crystalline silicon extending laterally from second n-type regions 6 on both sides of buried insulator region 5 and to meet and join each other above the center of buried insulator region 5. Since it is impossible to conduct the lateral selective epitaxial growth such that the rate of the lateral growth to the vertical growth is very much larger than 1, the epitaxial growth layer thickness $T_{SOi}$ is close to the lateral growth length LE. When the crystal growth front orients in the <100> directions on the (100) wafer surface, the surface defect density is $10^{-3}$ cm$^{-2}$ or lower. After the lateral selective epitaxial growth is over, the wafer is cleaned.

Figure 28:
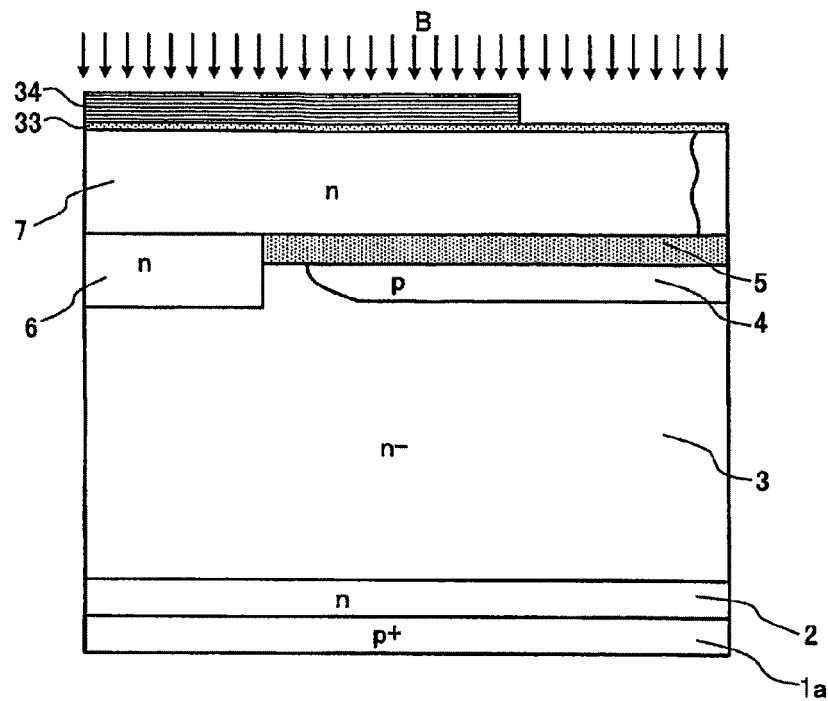
FIG. 28 is a seventh cross sectional view of the semiconductor device under the manufacture thereof by the manufacturing method according to the fourteenth embodiment of the invention.

Referring now to FIG. 28, the first n-type region 7 is polished by any of the well-known wafer polishing methods to provide the first n-type region 7 with a desired thickness and surface smoothness. The thickness variation caused in first n-type region 7 after the polish thereof is ±1 μm, which is close to the thickness variation in the silicon on insulator layer in bonded and etched back SOI substrates. After cleaning the wafer, the surface of the first n-type region 7 is oxidized to form a screen oxide film 33 for ion implantation. A photoresist is coated on screen oxide film 33. An ion implantation mask 34 is formed by patterning the photoresist by photolithography. Then, boron ions are implanted.

Figure 29:
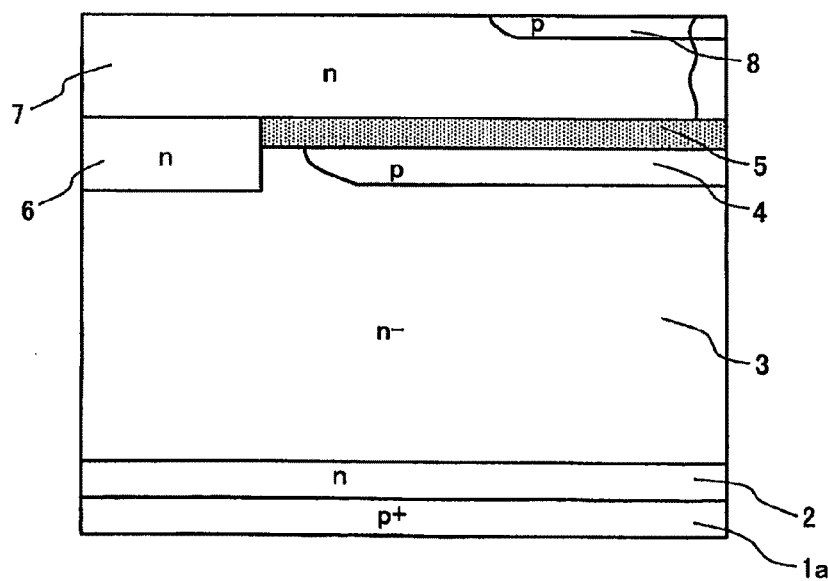
FIG. 29 is an eighth cross sectional view of the semiconductor device under the manufacture thereof by the manufacturing method according to the fourteenth embodiment of the invention.
Figure 30:
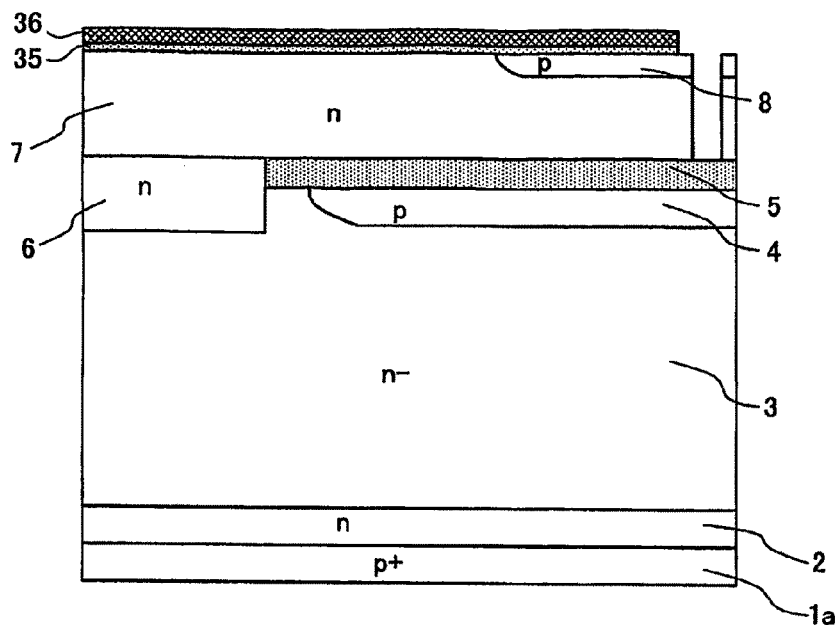
FIG. 30 is a ninth cross sectional view of the semiconductor device under the manufacture thereof by the manufacturing method according to the fourteenth embodiment of the invention.

Referring now to FIG. 29, the photoresist is removed by oxygen plasma ashing and the wafer is cleaned with $H_2SO_4$+ $H_2O_2$. Then, the wafer is annealed by rapid thermal process (RTP). Referring now to FIG. 30, a thin oxide film 35 and a nitride film 36 having a certain thickness are deposited on the wafer surface. Then, a hard mask for trench etching is formed by patterning oxide film 35 and nitride film 36 by photolithography and RIE. And, a trench is formed by RIE down to buried insulator region 5.

The trench is formed such that the trench encompasses the boundary region, in which the silicon layers, grown from both edges of buried insulator region 5 by the preceding lateral selective epitaxial growth, join each other. Since stacking faults and dislocations are liable to be caused in the boundary region, in which the silicon layers join each other, the trench formed in the boundary region facilitates removing the stacking faults and dislocations caused in the boundary region.

Figure 31:
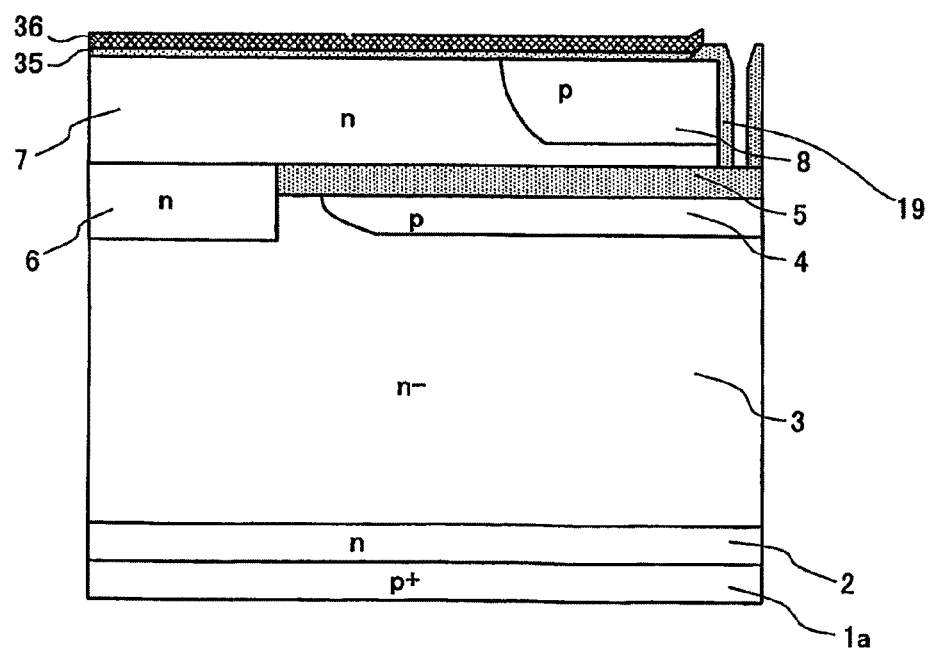
FIG. 31 is a tenth cross sectional view of the semiconductor device under the manufacture thereof by the manufacturing method according to the fourteenth embodiment of the invention.
Figure 32:
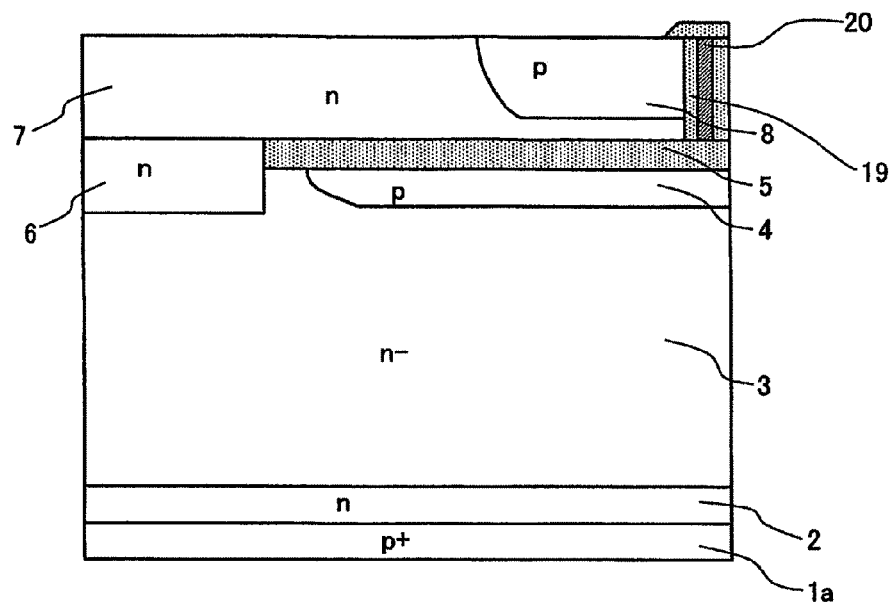
FIG. 32 is an eleventh cross sectional view of the semiconductor device under the manufacture thereof by the manufacturing method according to the fourteenth embodiment of the invention.

Referring now to FIG. 31, after sacrificial oxidation, an oxide with certain thickness is thermally formed to be the silicon oxide separation film 19, on the trench inner wall. Referring now to FIG. 32, polysilicon, which will be a polysilicon buried layer 20, is deposited in the trench and the deposited polysilicon is etched back. Then, the polysilicon is oxidized to a certain thickness. The hard mask formed of nitride film 36 for trench etching remaining on the wafer surface is removed by CDE (chemical dry etching). Then, the silicon oxide film on the wafer surface is removed by wet etching to expose the wafer surface. An oxide film may be deposited in substitution for depositing the polysilicon.

Figure 33:
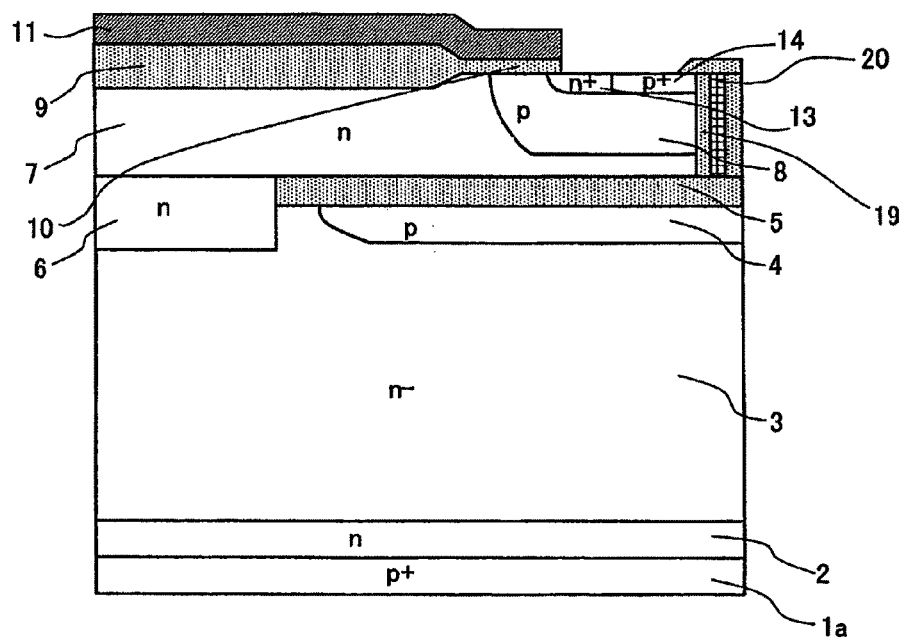
FIG. 33 is a twelfth cross sectional view of the semiconductor device under the manufacture thereof by the manufacturing method according to the fourteenth embodiment of the invention.

Referring now to FIG. 33, a LOCOS oxide film 9 is formed on the wafer surface. Gate oxide film 10 is formed after a sacrificial oxidation. Then, a polysilicon layer is deposited. After the gate electrode 11 is formed by photolithography and RIE. polysilicon reoxidation is conducted. An n⁺-type emitter region 13 self-aligned with the gate stack and a p⁺-type body contact region 14a adjacent to n⁺-type emitter region 13 are formed by photolithography and ion implantation. After removing the resist by oxygen plasma ashing and cleaning the wafer, annealing is conducted to activate the implanted ions.

Figure 34:
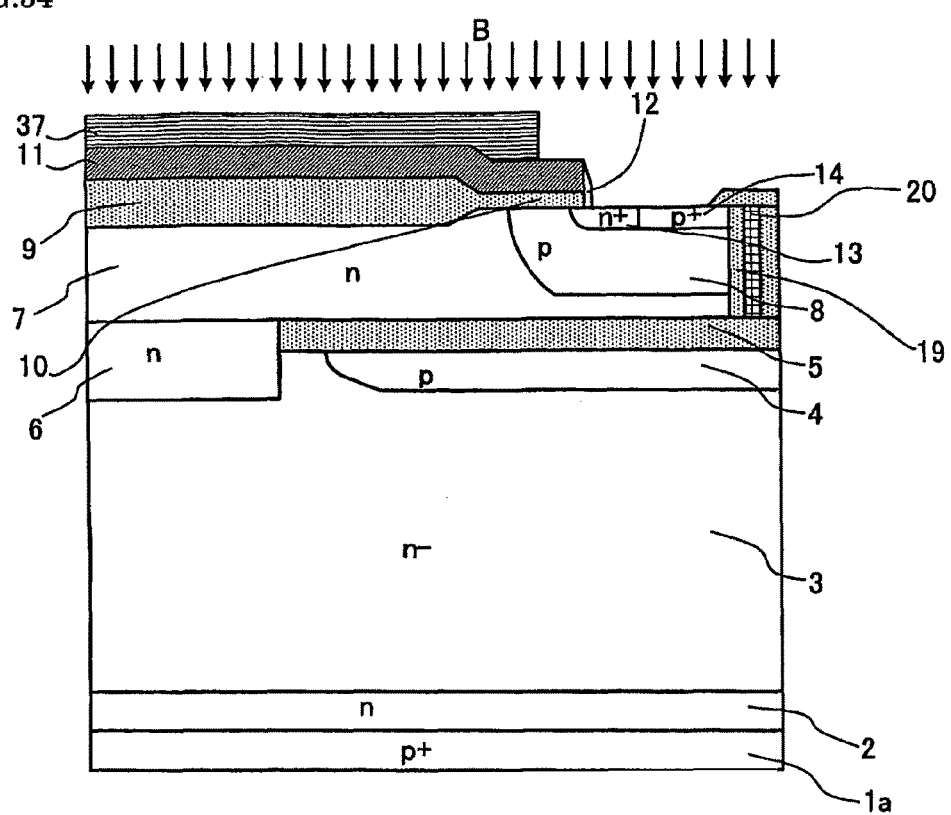
FIG. 34 is a thirteenth cross sectional view of the semiconductor device under the manufacture thereof by the manufacturing method according to the fourteenth embodiment of the invention.

Then, a silicon oxide film or a silicon nitride film from 150 nm to 300 nm in thickness is deposited on the entire wafer surface. Referring now to FIG. 34, a gate-side-wall spacer film 12 is formed on the edge of the gate stack by RIE. Then, an ion implantation mask 37 is formed by coating a photoresist on polysilicon gate electrode 11 and by patterning the photoresist by photolithography. Then, a p⁺-type buried low-resistance region 14b is formed below n⁺-type emitter region 13 by implanting boron ions under high-energy, by removing the photoresist with oxygen plasma ashing, and by annealing to activate the implanted boron ions.

Figure 35:
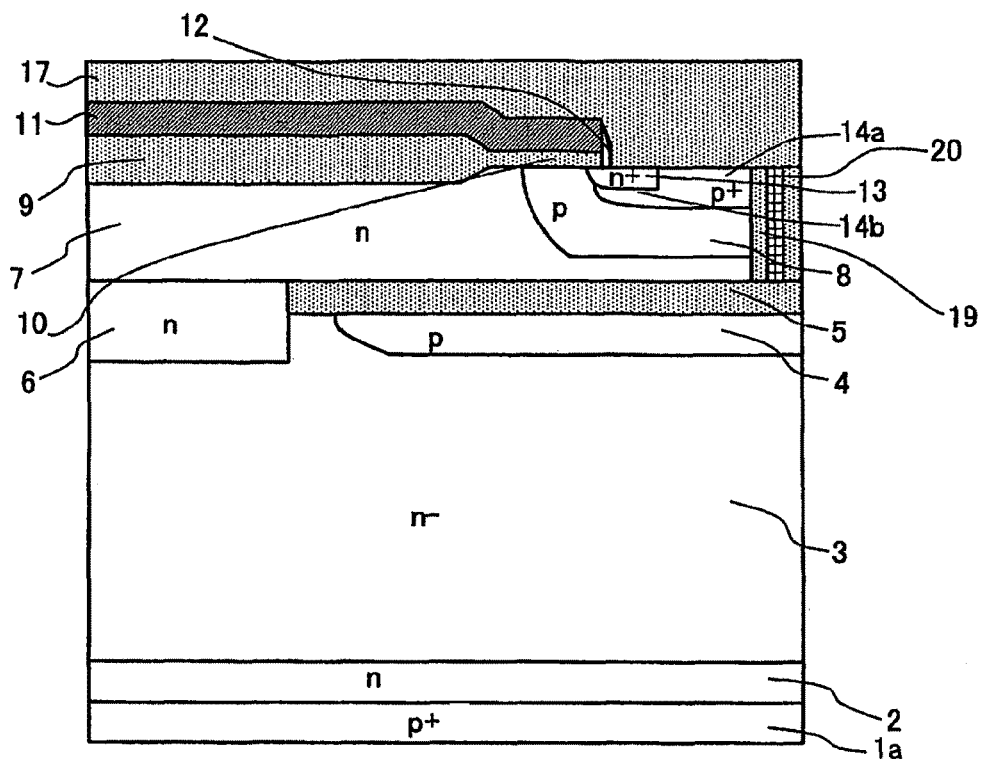
FIG. 35 is a fourteenth cross sectional view of the semiconductor device under the manufacture thereof by the manufacturing method according to the fourteenth embodiment of the invention.

Referring now to FIG. 35, an interlayer insulator film 17, formed of an high temperature CVD oxide (HTO) and a BPSG silicon oxide film, is deposited on the entire wafer surface. A contact hole is opened through interlayer insulator film 17. An emitter barrier layer 16 and an emitter electrode 15 are formed. Finally, the IGBT shown in FIG. 1 is completed by forming a collector electrode 18. If polysilicon gate electrode 11 is shortened as shown in FIG. 5, it is effective to pattern polysilicon gate electrode 11 in forming the gate stack. The step of forming gate-side-wall spacer film 12 and the step of forming p⁺-type buried low-resistance region 14b may be omitted if intended. The IGBT according to the first embodiment may be manufactured by the other methods than the manufacturing method according to the fourteenth embodiment.

The semiconductor devices having a partial SOI structure are manufactured with low manufacturing costs by the manufacturing method according to the fourteenth embodiment of the invention. Therefore, inexpensive semiconductor devices having a partial SOI structure are obtained. If an n-type semiconductor substrate, which will be an n⁺-type drain layer 1b, is used in substitution for the p-type semiconductor substrate, the MOSFET according to the seventh embodiment will be manufactured by the manufacturing method according to the fourteenth embodiment. The manufacturing method according to the fourteenth embodiment is applicable not only to manufacturing the IGBT according to the first embodiment and the MOSFET according to the seventh embodiment, but also to manufacturing the IGBT according to the second embodiment and the MOSFET according to the eighth embodiment, which have a planar gate structure.

Fifteenth Embodiment

The manufacturing method according to a fifteenth embodiment of the invention is applicable, for example, to manufacturing the semiconductor device according to the third embodiment. FIGS. 36 through 40 are the cross sectional views of the semiconductor device under the manufacture thereof by the manufacturing method according to the fifteenth embodiment. First, n-type buffer layer 2, n⁻-type drift layer 3, p-type region 4, buried insulator region 5, second n-type region 6 and first n-type region 7 are formed on the substrate, which will be p⁺-type collector layer 1a, through the steps described in FIGS. 22 through 27. Then, the first n-type region 7 is polished by any of the well-known wafer polishing methods to provide the first n-type region 7 with a desired thickness and surface smoothness.

Although not illustrated, the trench separation structure for dielectrically separating a low-voltage control device (e.g. low-voltage lateral NMOS transistor 300 shown in FIG. 21) is formed by conducting the steps similar to the steps described in FIGS. 30 through 32 in the region, in which the low-voltage control device integrated with an IGBT onto the same semiconductor substrate is to be formed. In this case, the trench separation structure is formed not in the region, in which the IGBT is to be formed.

Figure 36:
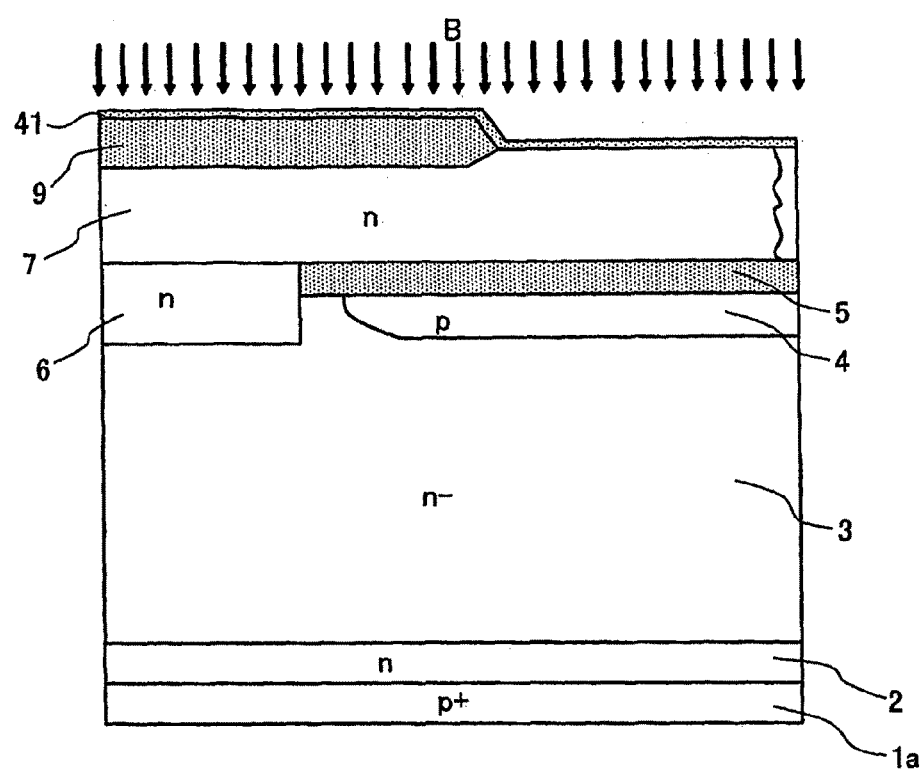
FIG. 36 is a first cross sectional view of a semiconductor device under the manufacture thereof by the manufacturing method according to a fifteenth embodiment of the invention.

Referring now to FIG. 36, a LOCOS oxide film 9 is formed on the wafer surface and a screen oxide film 41 for ion implantation is formed on the wafer surface. Then, an ion implantation mask is formed by coating a photoresist on the screen oxide film 41 and by patterning the photoresist by photolithography. Although not described in FIG. 36, the ion implantation mask covers the region, in which the low-voltage control device is to be formed. Then, boron ions are implanted.

Figure 37:
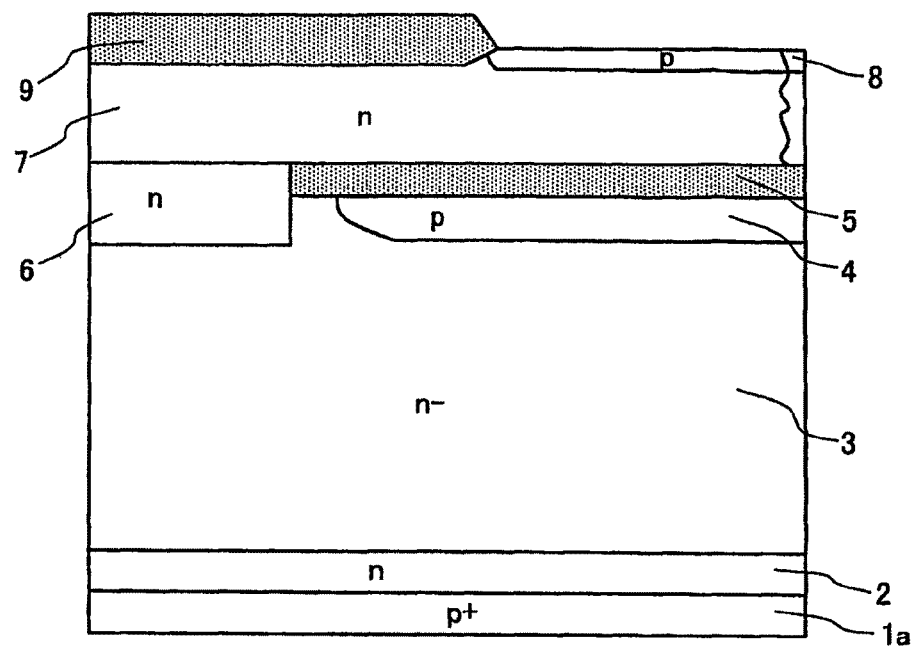
FIG. 37 is a second cross sectional view of the semiconductor device under the manufacture thereof by the manufacturing method according to the fifteenth embodiment of the invention.
Figure 38:
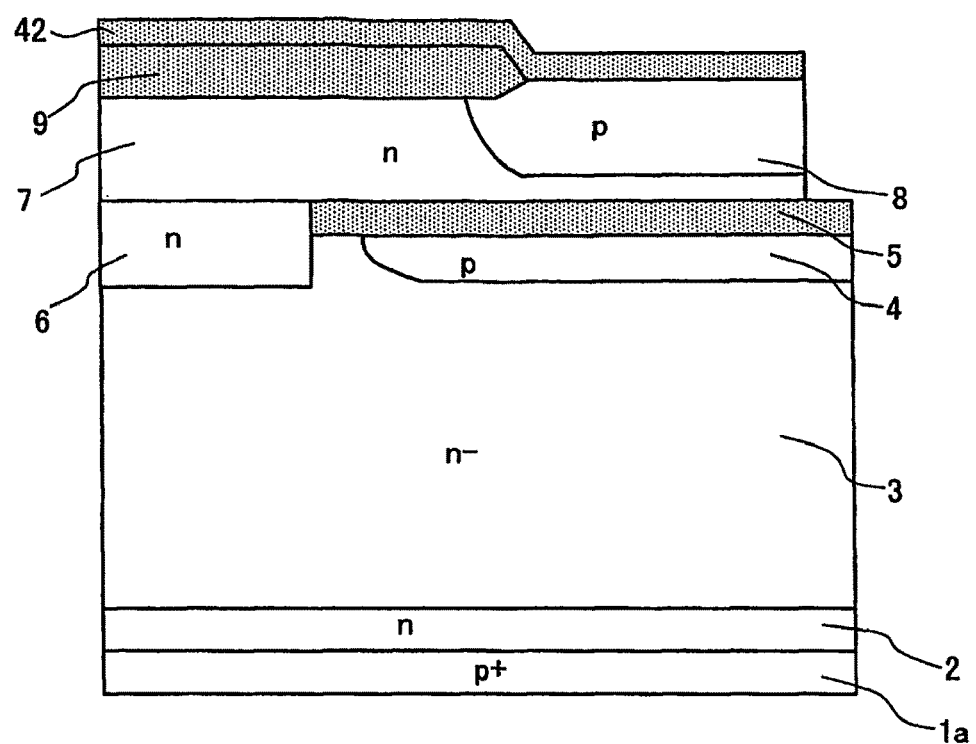
FIG. 38 is a third cross sectional view of the semiconductor device under the manufacture thereof by the manufacturing method according to the fifteenth embodiment of the invention.

Referring now to FIG. 37, the photoresist is removed by oxygen plasma ashing and the wafer is cleaned with $H_2SO_4$+$H_2O_2$. Then, the wafer is annealed by rapid thermal process (RTP). Referring now to FIG. 38, silicon HTO film 42 is deposited on the wafer surface and a hard mask for trench etching is formed by patterning silicon HTO film 42 by photolithography and RIE. And, a trench is formed by RIE down to buried insulator region 5.

Figure 39:
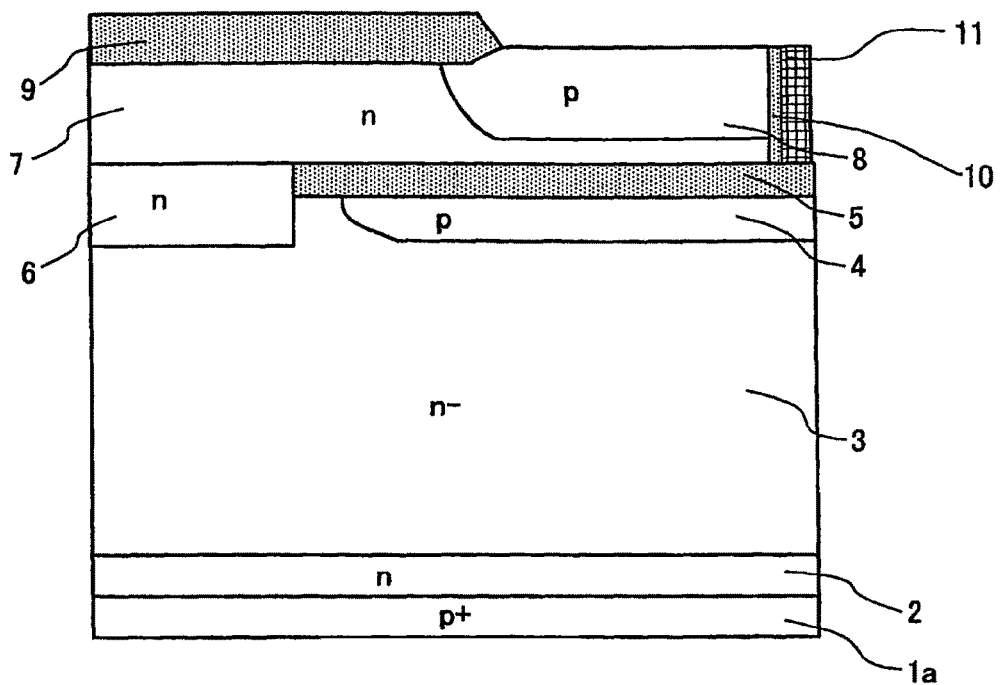
FIG. 39 is a fourth cross sectional view of the semiconductor device under the manufacture thereof by the manufacturing method according to the fifteenth embodiment of the invention.

The trench is formed in the same manner as according to the fourteenth embodiment such that the trench encompasses the boundary region, in which the silicon layers, grown from both edges of buried insulator region 5 by the preceding lateral selective epitaxial growth, join each other. After forming the trench, the step of sacrifice oxidation and the step of driving are conducted to form a p-type body region 8. Referring now to FIG. 39, silicon HTO film 42 is removed by wet etching. After conducting sacrifice oxidation, a gate oxide film 10 is formed on the trench side wall. Then, polysilicon is deposited to fill the trench and a polysilicon gate electrode 11 is formed by etching back the deposited polysilicon.

Figure 40:
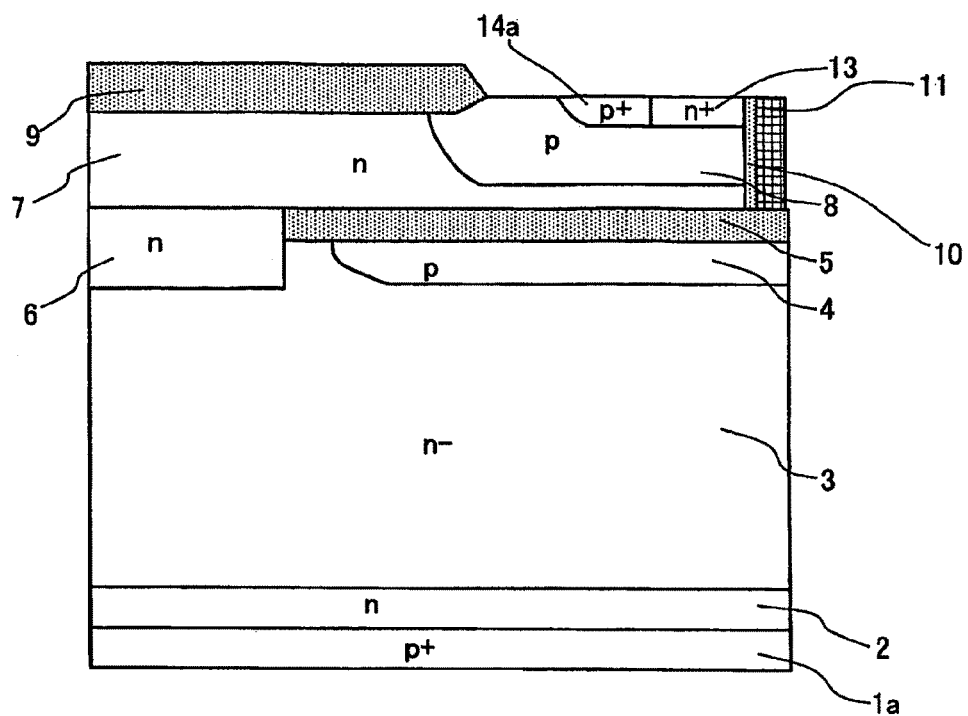
FIG. 40 is a fifth cross sectional view of the semiconductor device under the manufacture thereof by the manufacturing method according to the fifteenth embodiment of the invention.

Referring now to FIG. 40, an n⁺-type emitter region 13 and a p⁺-type body contact region 14a are formed in p-type body region 8 by photolithography and ion implantation. After removing the photoresist by oxygen plasma ashing and cleaning the wafer, annealing is conducted to activate the implanted ions. Then, an interlayer insulator film 17, formed of an HTO and a BPSG silicon oxide film, is deposited on the entire wafer surface. A contact hole is opened through interlayer insulator film 17. An emitter barrier layer 16 and an emitter electrode 15 are formed. Finally, the IGBT shown in FIG. 8 is completed by forming the collector electrode 18. The IGBT according to the third embodiment may be manufactured by methods other than the manufacturing method according to the fifteenth embodiment.

The semiconductor devices having a partial SOI structure are manufactured with low manufacturing costs by the manufacturing method according to the fifteenth embodiment of the invention. Therefore, inexpensive semiconductor devices having a partial SOI structure are obtained. If an n-type semiconductor substrate, which will be n⁺-type drain layer 1b, is used in substitution for the p-type semiconductor substrate, the MOSFET according to the ninth embodiment will be manufactured by the manufacturing method according to the fifteenth embodiment. The manufacturing method according to the fifteenth embodiment is applicable not only to manufacturing the semiconductor device according to the third and ninth embodiments but also to manufacturing the semiconductor devices having a trench gate structure.

Sixteenth Embodiment

Figure 41:
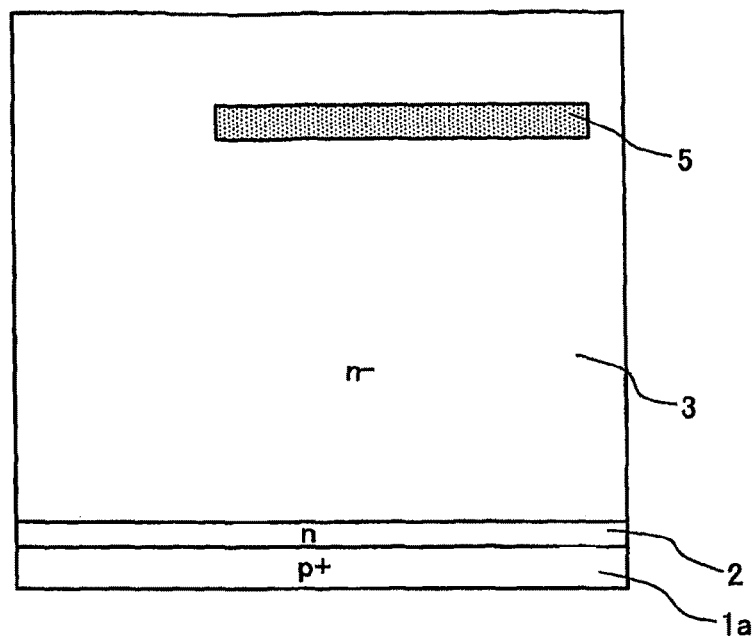
FIG. 41 is a first cross sectional view of a semiconductor device under the manufacture thereof by the manufacturing method according to a sixteenth embodiment of the invention.

The manufacturing method according to a sixteenth embodiment of the invention is applicable, for example, to manufacturing the semiconductor device according to the sixth embodiment. FIGS. 41 through 47 are the cross sectional views of the semiconductor device under the manufacture thereof by the manufacturing method according to the sixteenth embodiment. Referring now to FIG. 41, a substrate is manufactured by growing an n-type buffer layer 2 on a semiconductor substrate that will be a p⁺-type collector layer 1a, by growing an n⁻-type drift layer 3 on n-type buffer layer 2, and by forming a buried insulator region 5 in n⁻-type drift layer 3. Buried insulator region 5 is from 0.1 to 2 μm in thickness. The silicon layer on buried insulator region 5 is from 0.1 to 7 μm in thickness.

Figure 42:
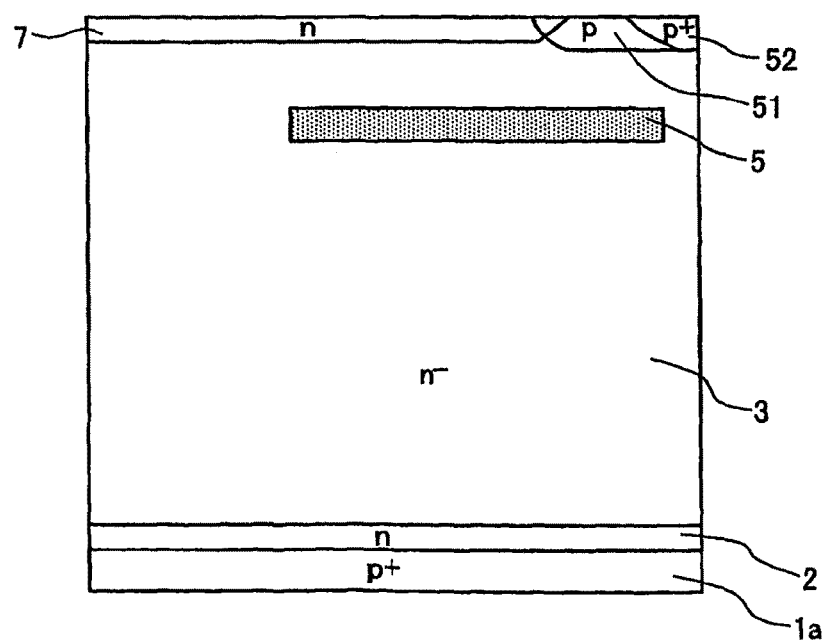
FIG. 42 is a second cross sectional view of the semiconductor device under the manufacture thereof by the manufacturing method according to the sixteenth embodiment of the invention.
Figure 43:
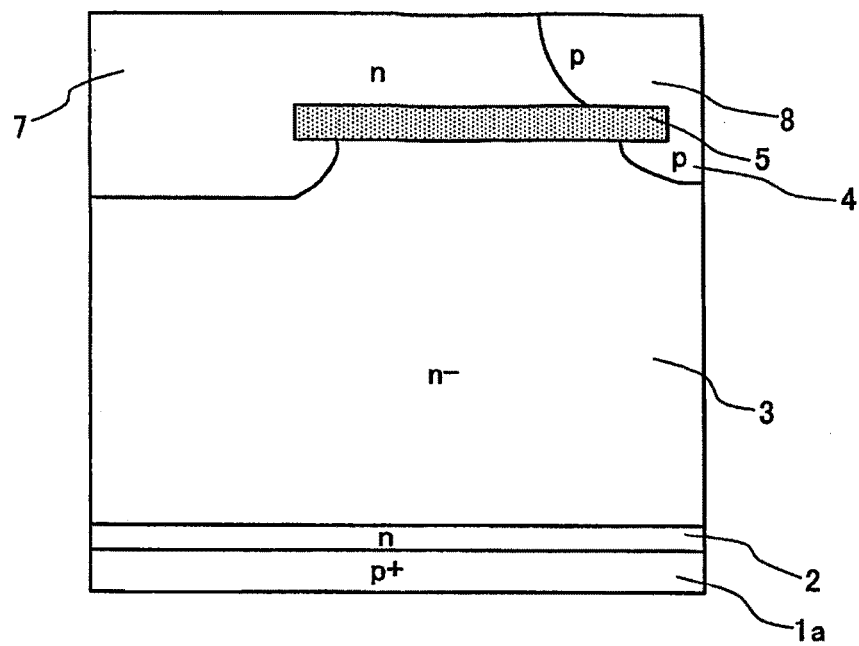
FIG. 43 is a third cross sectional view of the semiconductor device under the manufacture thereof by the manufacturing method according to the sixteenth embodiment of the invention.

Referring now to FIG. 42, a screen oxide film for ion implantation is formed on the wafer surface, the wafer is patterned by photolithography, and p-type regions 51 and 52, which will be a p-type body region 8, are formed by implanting boron ions. After removing the photoresist, the wafer is again patterned by photolithography, the first n-type region 7 is formed by implanting phosphorus ions, then the photoresist is removed. Referring now to FIG. 43, p-type body region 8 is thermally driven so that a p-type region 4 may be formed below buried insulator region 5.

Figure 44:
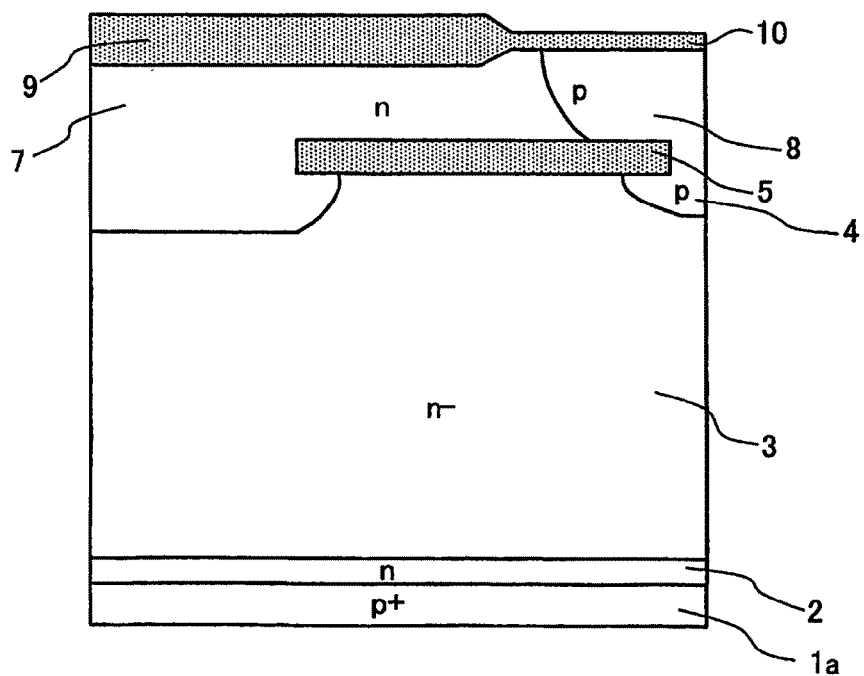
FIG. 44 is a fourth cross sectional view of the semiconductor device under the manufacture thereof by the manufacturing method according to the sixteenth embodiment of the invention.
Figure 45:
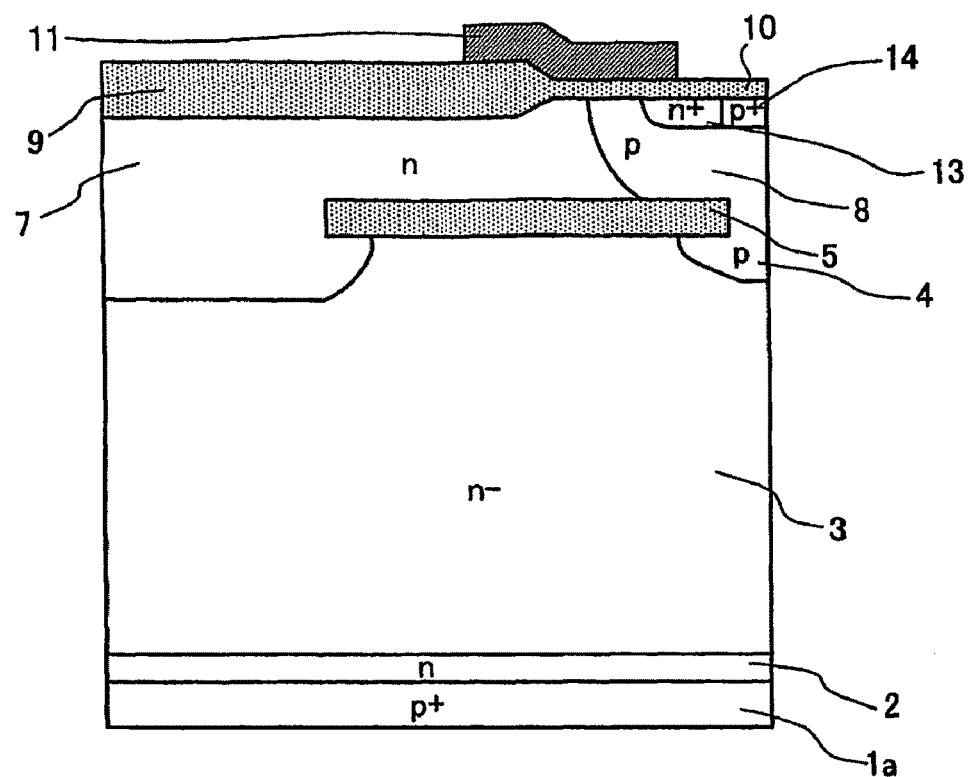
FIG. 45 is a fifth cross sectional view of the semiconductor device under the manufacture thereof by the manufacturing method according to the sixteenth embodiment of the invention.
Figure 46:
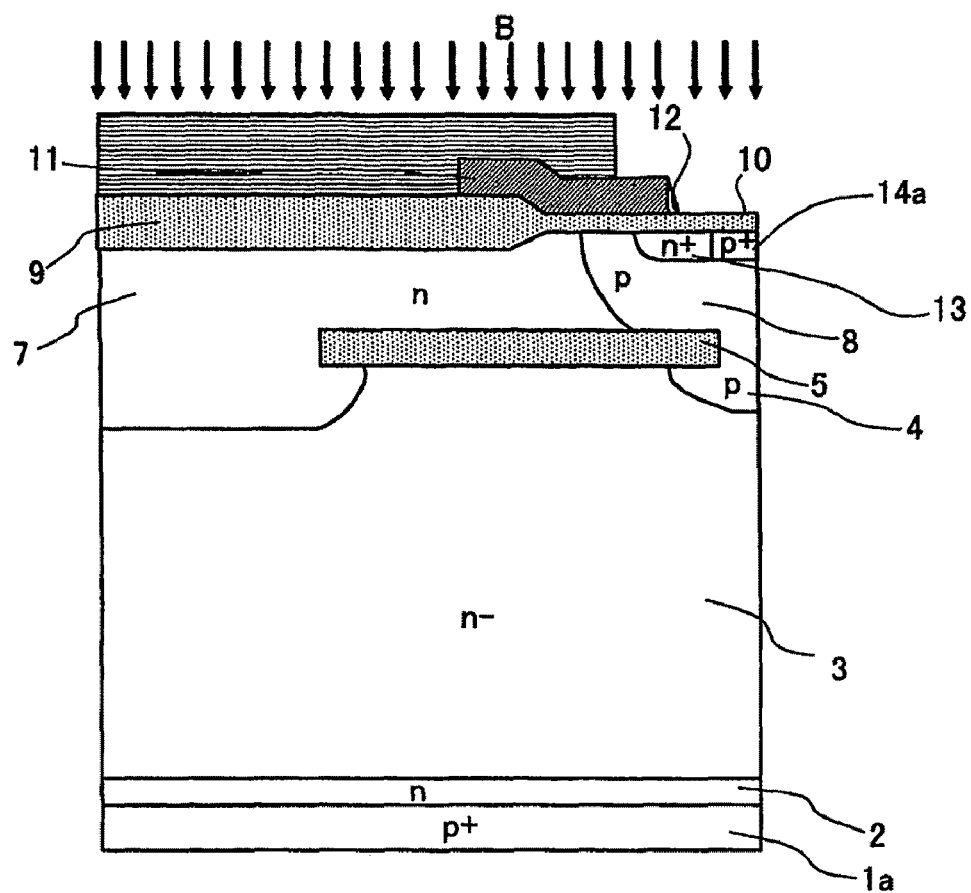
FIG. 46 is a sixth cross sectional view of the semiconductor device under the manufacture thereof by the manufacturing method according to the sixteenth embodiment of the invention.

Referring now to FIG. 44, a LOCOS oxide film 9 is formed on the wafer surface. A gate oxide film 10 is formed after a sacrificial oxidation. The subsequent steps are the same with the steps according to the fourteenth embodiment. Referring now to FIG. 45, a polysilicon gate electrode 11 is formed by depositing doped polysilicon on the wafer surface. An n⁺-type emitter region 13 and a p⁺-type body contact region 14a are formed by photolithography and ion implantation. Referring now to FIG. 46, a gate-side-wall spacer film 12 is formed. A photolithographic process is conducted and boron ions are implanted under high energy.

Figure 47:
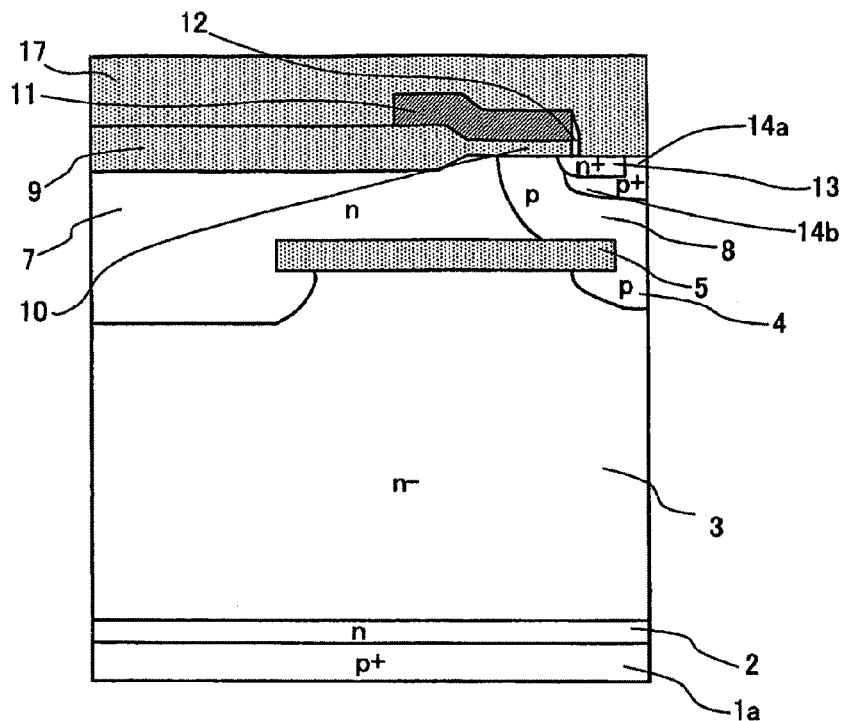
FIG. 47 is a seventh cross sectional view of the semiconductor device under the manufacture thereof by the manufacturing method according to the sixteenth embodiment of the invention.

Referring now to FIG. 47, the implanted boron ions are activated by annealing to form a p⁺-type buried low-resistance region 14b below n⁺-type emitter region 13. Then, an interlayer oxide film 17 (HTO+BPSG silicon oxide film) is deposited on the entire wafer surface. Then, a contact hole is opened through interlayer insulator film 17, and an emitter barrier layer 16 and an emitter electrode 15 are formed. Finally, a collector electrode 18 is formed. Thus, the IGBT shown in FIG. 14 is completed.

In forming the gate stack, polysilicon gate electrode 11 may not be shortened so to form the structure shown in FIG. 13. The step of forming gate-side-wall spacer film 12 and the step of forming p⁺-type buried low-resistance region 14b may be omitted with if intended. The IGBT according to the sixth embodiment may be manufactured by the other methods than the manufacturing method according to the sixteenth embodiment.

One of the methods for manufacturing the substrate shown in FIG. 41 will be described below. First, an n-type buffer layer 2 and an n$^-$-type drift layer 3 are grown by epitaxial growth on a semiconductor substrate, which will be a p$^+$-type collector layer 1a. Another n-type wafer is prepared and an oxide film, which will be buried insulator region 5, is formed on the n-type wafer. And, a bonded SOI wafer is manufactured by bonding the semiconductor substrate including n$^-$-type drift layer 3 and the n-type wafer having the oxide film thereon such that the surface of n$^-$-type drift layer 3 and the surface of the oxide film are bonded together. After thinning the bonded SOI wafer by polishing the n-type wafer side, a trench is formed through a part of the oxide film and the trench is filled with an n-type semiconductor by selective epitaxial growth.

Alternatively, the substrate shown in FIG. 41 is manufactured in the following manner. First, an n-type buffer layer 2 and an n$^-$-type drift layer 3 are grown by epitaxial growth on a semiconductor substrate, which will be a p$^+$-type collector layer 1a. Then, an oxide film mask is formed on n$^-$-type drift layer 3. A buried insulator region 5 is formed by oxygen ion implantation and by the subsequent heat treatment. After removing the oxide film mask, silicon having a desired thickness is deposited on buried insulator region 5 by the epitaxial growth conducted over the entire wafer surface.

The semiconductor devices having a partial SOI structure are manufactured with low manufacturing costs by the manufacturing method according to the sixteenth embodiment of the invention. Therefore, inexpensive semiconductor devices having a partial SOI structure are obtained. If an n-type semiconductor substrate, which will be an n$^+$-type drain layer 1b, is used in substitution for the p-type semiconductor substrate, the MOSFET according to the twelfth embodiment will be manufactured by the manufacturing method according to the sixteenth embodiment.

Seventeenth Embodiment

Figure 48:
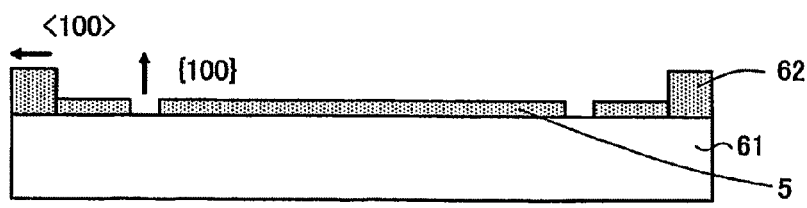
FIG. 48 is a first cross sectional view of a semiconductor device under the manufacture thereof by the manufacturing method according to a seventeenth embodiment of the invention.
Figure 49:
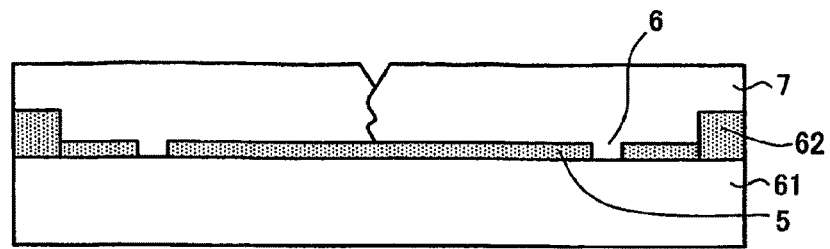
FIG. 49 is a second cross sectional view of the semiconductor device under the manufacture thereof by the manufacturing method according to the seventeenth embodiment of the invention.
Figure 50:
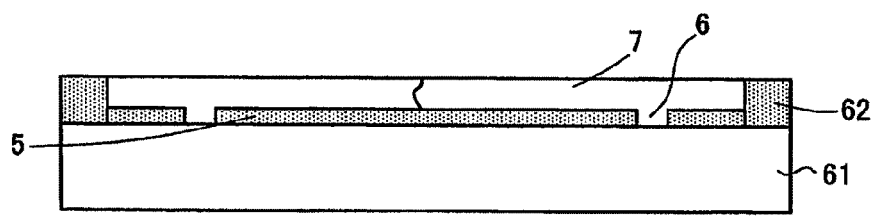
FIG. 50 is a third cross sectional view of the semiconductor device under the manufacture thereof by the manufacturing method according to the seventeenth embodiment of the invention.

The manufacturing method according to a seventeenth embodiment of the invention is applicable to manufacturing a substrate used for manufacturing a thin film device according, for example, to the second embodiment, the first n-type region 7 thereof is 1 μm or less in thickness. FIGS. 48 through 50 are cross sectional views of the semiconductor device under the manufacture thereof by the manufacturing method according to the seventeenth embodiment. Referring now to FIG. 48, an epitaxial substrate 61 is prepared by growing an n-type buffer layer 2 (not shown) and an n$^-$-type drift layer 3 (not shown) on a semiconductor substrate (not shown), which will be a p$^+$-type collector layer 1a or an n$^+$-type drain layer 1b.

Then, oxide films 62 as thick as the first n-type region 7 are deposited or grown on n$^-$-type drift layer 3 in epitaxial substrate 61 and oxide films 62 are patterned. Then, an oxide film, which will be a buried insulator region 5, is deposited or grown. Then, the oxide film is patterned and windows for growing the second n-type regions 6 are opened. Referring now to FIG. 49, selective epitaxial growth is conducted to form the second n-type regions 6. Subsequently, lateral epitaxial growth is conducted to form semiconductor layers, which will be the first n-type region 7, such that the semiconductor layers are thicker than oxide film 62.

Referring now to FIG. 50, the semiconductor layers, which will be the first n-type region 7, are polished by one of the well-known substrate polishing methods until oxide films 62 are exposed. Oxide films 62 functions as a polishing stopper layers for stopping polishing or as a detector layers for detecting the polishing end point. The manufacturing method according to the seventeenth embodiment facilitates forming the first n-type region 7 to be thin and uniform in thickness. Therefore, the thin film devices the same as the device according to the second embodiment are manufactured by the method according to the fourteenth embodiment using the substrate manufactured by the method according to the seventeenth embodiment.

Eighteenth Embodiment

Figure 51:
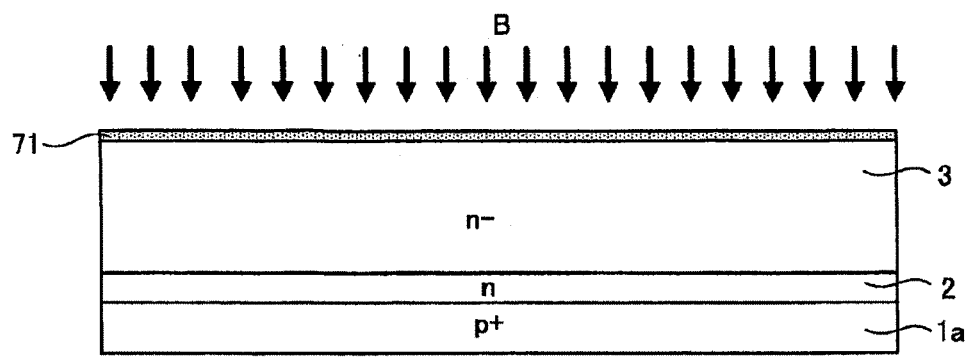
FIG. 51 is a first cross sectional view of a semiconductor device under the manufacture thereof by the manufacturing method according to an eighteenth embodiment of the invention.

The manufacturing method according to an eighteenth embodiment of the invention is one of the methods for manufacturing a substrate used for manufacturing the semiconductor device, the p-type region 4 thereof is in contact with second n-type region 6, according to the fourth embodiment, the fifth embodiment, the tenth embodiment, or the eleventh embodiment. FIGS. 51 through 58 are cross sectional views of the semiconductor device under the manufacture thereof by the manufacturing method according to the eighteenth embodiment. Referring now to FIG. 51, a buffer layer 2 and an n$^-$-type drift layer 3 are grown by epitaxy on a semiconductor substrate, which will be a p$^+$-type collector layer 1a (or an n$^+$-type drain layer 1b).

Figure 52:
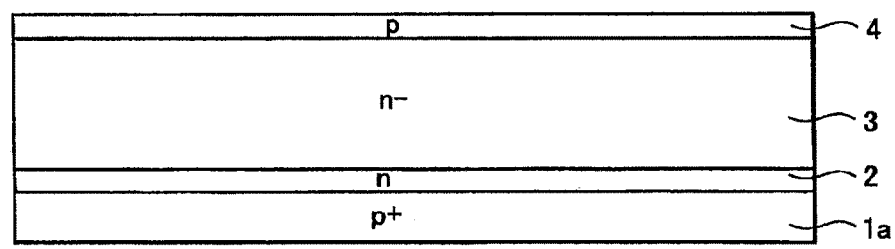
FIG. 52 is a second cross sectional view of the semiconductor device under the manufacture thereof by the manufacturing method according to the eighteenth embodiment of the invention.
Figure 53:
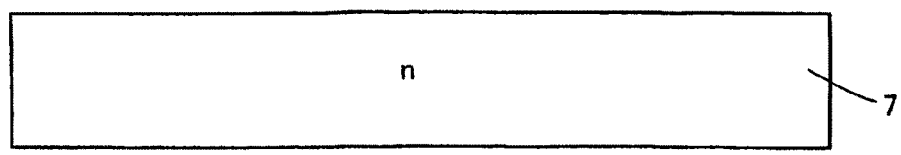
FIG. 53 is a third cross sectional view of the semiconductor device under the manufacture thereof by the manufacturing method according to the eighteenth embodiment of the invention.
Figure 54:
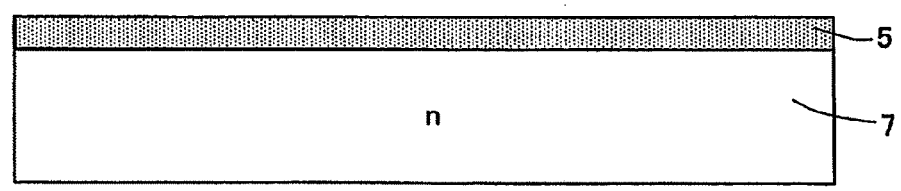
FIG. 54 is a fourth cross sectional view of a semiconductor device under the manufacture thereof by the manufacturing method according to the eighteenth embodiment of the invention.

Then, a screen oxide film 71 for ion implantation is formed on n$^-$-type drift layer 3. Referring now to FIG. 52, a p-type region 4 is formed in the surface of n$^-$-type drift layer 3 through a photolithographic process and boron ion implantation. Then, a thin thermal oxide film (not shown) is formed in the surface of p-type region 4. The thermal oxide film for restricting the diffusion of p-type region 4 to the minimum thereof is formed to be as thin as possible. Besides, the other n-type wafer, which will be a first n-type region 7, is prepared as shown in FIG. 53. Referring now to FIG. 54, an oxide film, which will be a buried insulator region 5, is formed by thermal oxidation in the surface of the n-type wafer or deposited on the n-type wafer.

Figure 55:
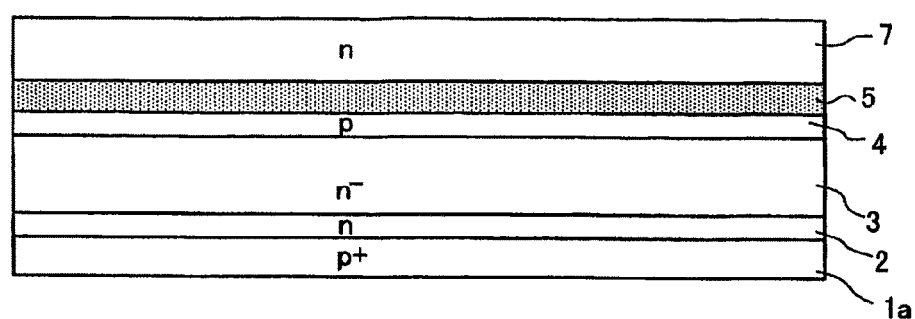
FIG. 55 is a fifth cross sectional view of the semiconductor device under the manufacture thereof by the manufacturing method according to the eighteenth embodiment of the invention.
Figure 56:
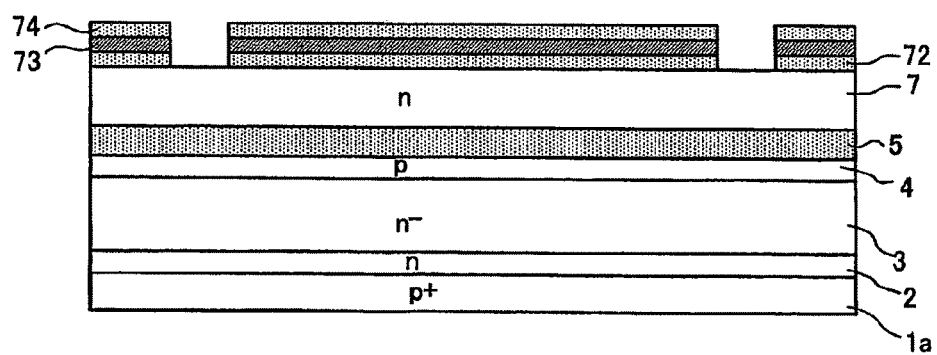
FIG. 56 is a sixth cross sectional view of the semiconductor device under the manufacture thereof by the manufacturing method according to the eighteenth embodiment of the invention.

Referring now to FIG. 55, the wafer shown in FIG. 52 and the wafer shown in FIG. 54 are bonded such that p-type region 4 and buried insulator region 5 are in contact with each other. The oxide films are disposed on both wafers so that the defects in the bonding boundary of the device may not affect adversely. Then, the first n-type region 7 is polished by one of the well-known substrate polishing methods until the first n-type region 7 has a predetermined thickness. Referring now to FIG. 56, a silicon oxide film 72, a polysilicon film 73 and a silicon oxide film 74 are laminated one by one on the polished surface of first n-type region 7 to form a composite hard mask. A hard mask for trench etching is formed by patterning the composite hard mask by photolithography and RIE.

Figure 57:
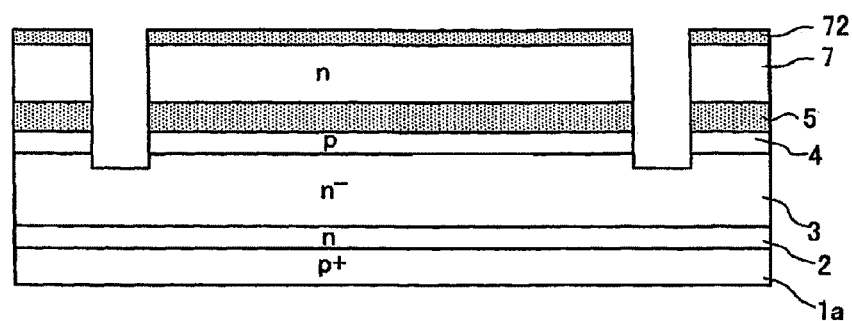
FIG. 57 is a seventh cross sectional view of the semiconductor device under the manufacture thereof by the manufacturing method according to the eighteenth embodiment of the invention.
Figure 58:
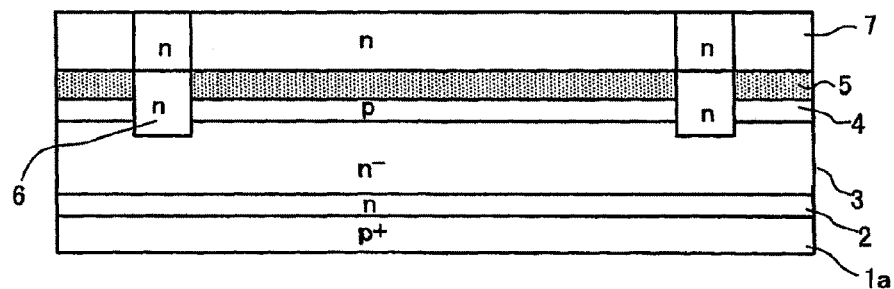
FIG. 58 is an eighth cross sectional view of the semiconductor device under the manufacture thereof by the manufacturing method according to the eighteenth embodiment of the invention.
Figure 59:
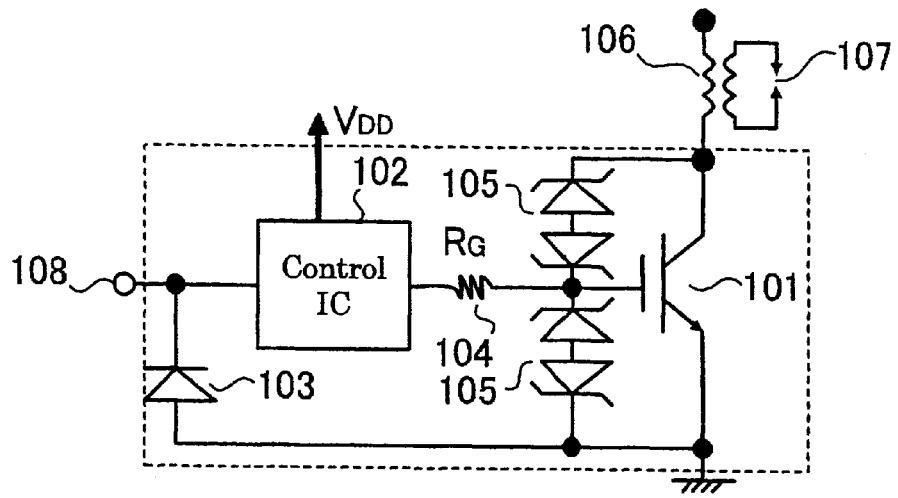
FIG. 59 is a block circuit diagram of a standard ignition system that employs an IGBT.

Referring now to FIG. 57, trenches are formed by RIE down to n$^-$-type drift layer 3 through the first n-type region 7, the buried insulator region 5 and the p-type region 4 such that the n$^-$-type drift layer 3 is removed partly. Then, the damages caused by the trench etching are removed by sacrificial oxidation. Referring now to FIG. 58, the lower half of the trench is filled with the second n-type region 6 by selective epitaxial growth. The epitaxial growth is continued until the upper half of the trench is filled with the first n-type region 7 to the wafer surface. Then, the oxide film on the wafer surface is removed by wet etching.

It is possible to manufacture the semiconductor device according to the fourth embodiment, the fifth embodiment, the tenth embodiment, or the eleventh embodiment by the other manufacturing methods than the manufacturing method according to the eighteenth embodiment. It is possible to manufacture the semiconductor device according to the first embodiment, the second embodiment, the third embodiment, the seventh embodiment, the eighth embodiment, or the ninth embodiment by the manufacturing method according to the eighteenth embodiment.

Although the invention has been described in connection with the embodiments thereof, changes and modifications are obvious to those skilled in the art without departing from the true spirit of the invention. For example, the dimensions and the concentrations described for the embodiments are exemplary. Although the first conductivity type is an n-type and the second conductivity type is a p-type in the semiconductor devices according to any of the embodiments of the invention, the invention is also applicable to the semiconductor device, in which the first conductivity type is a p-type and the second conductivity type is an n-type.

INDUSTRIAL APPLICABILITY

As described above, the semiconductor device and the manufacturing method according to the invention are useful for obtaining an intelligent power device, formed by integrating a bipolar transistor and a vertical MOS (metal-oxide film-semiconductor structure) transistor, which exhibits low on-resistance, a low on-voltage, excellent thermal properties and a high short-circuit withstanding capability, and influences less parasitically on the low-voltage device in the control section. Especially, the semiconductor device and the manufacturing method according to the invention are suited for obtaining a switching device used in the ignition system for automobiles.

The invention claimed is:

1. A semiconductor device comprising:
a drift layer of a first conductivity type;
a first region of the first conductivity type above the drift layer, the resistivity of the first region being lower than the resistivity of the drift layer;
a buried insulator region disposed locally between the first region and the drift layer;
a region of a second conductivity type between the buried insulator region and the drift layer, the region of the second conductivity type being in contact with the drift layer;
a body region of the second conductivity type in contact with the first region;
a low-resistance region of the first conductivity type in the body region;
a contact region of the second conductivity type in the body region;
a front surface electrode connected electrically to the contact region and the low-resistance region;
a gate insulator film on the portion of the body region between the first region and the low-resistance region;
a gate electrode on the side opposite to the body region with the gate insulator film interposed therebetween; and
a second region of the first conductivity type disposed locally between the first region and the drift layer, the resistivity of the second region being lower than the resistivity of the first region.

2. The semiconductor device according to claim 1, wherein the region of the second conductivity type is a floating region.

3. A semiconductor device comprising:
a drift layer of a first conductivity type;
a first region of the first conductivity type above the drift layer, the resistivity of the first region being lower than the resistivity of the drift layer;
a buried insulator region disposed locally between the first region and the drift layer;
a region of a second conductivity type between the buried insulator region and the drift layer, the region of the second conductivity type being in contact with the drift layer;
a body region of the second conductivity type in contact with the first region;
a low-resistance region of the first conductivity type in the body region;
a contact region of the second conductivity type in the body region;
a front surface electrode connected electrically to the contact region and the low-resistance region;
a gate insulator film on the portion of the body region between the first region and the low-resistance region;
a gate electrode on the side opposite to the body region with the gate insulator film interposed therebetween; and
a trench gate structure comprising a trench extended down to the buried insulator region, the trench comprising the gate insulator film and the gate electrode disposed therein.

4. The semiconductor device according to claim 1, the semiconductor device comprising a planar gate structure comprising the gate insulator film and the gate electrode disposed on the body region.

5. The semiconductor device according to claim 1, further comprising a buried low-resistance region of the second conductivity type disposed below the low-resistance region of the first conductivity type in the body region of the second conductivity type.

6. The semiconductor device according to claim 1, wherein the body region is in contact with the buried insulator region.

7. The semiconductor device according to claim 1, wherein the body region is above the buried insulator region.

8. The semiconductor device according to claim 1, further comprising a low-resistance layer of the second conductivity type on the side of the drift layer opposite to the first region and a back surface electrode connected electrically to the low-resistance layer of the second conductivity type.

9. The semiconductor device according to claim 1, further comprising a low-resistance layer of the first conductivity type on the side of the drift layer opposite to the first region and a back surface electrode connected electrically to the low-resistance layer of the first conductivity type.

10. The semiconductor device according to claim 3, wherein the region of the second conductivity type is a floating region.

11. The semiconductor device according to claim 3, further comprising a buried low-resistance region of the second conductivity type disposed below the low-resistance region of the first conductivity type in the body region of the second conductivity type.

12. The semiconductor device according to claim 3, wherein the body region is in contact with the buried insulator region.

13. The semiconductor device according to claim 3, further comprising a low-resistance layer of the second conductivity type on the side of the drift layer opposite to the first region and a back surface electrode connected electrically to the low-resistance layer of the second conductivity type.

14. The semiconductor device according to claim 3, further comprising a low-resistance layer of the first conductivity type on the side of the drift layer opposite to the first region and a back surface electrode connected electrically to the low-resistance layer of the first conductivity type.

* * * * *